United States Patent
Wang

(10) Patent No.: US 10,431,308 B1
(45) Date of Patent: Oct. 1, 2019

(54) MEMORY CELL SIZE REDUCTION FOR SCALABLE LOGIC GATE NON-VOLATILE MEMORY ARRAYS

(71) Applicant: FlashSilicon Incorporation, Diamond Bar, CA (US)

(72) Inventor: Lee Wang, Diamond Bar, CA (US)

(73) Assignee: Flashsilicon Incorporation, Diamond Bar, CA (US)

( * ) Notice: Subject to any disclaimer, the term of this patent is extended or adjusted under 35 U.S.C. 154(b) by 0 days.

(21) Appl. No.: 16/055,614

(22) Filed: Aug. 6, 2018

(51) Int. Cl.
*G11C 11/34* (2006.01)
*G11C 16/04* (2006.01)
*H01L 27/11558* (2017.01)
*G11C 16/10* (2006.01)

(52) U.S. Cl.
CPC .......... *G11C 16/0441* (2013.01); *G11C 16/10* (2013.01); *H01L 27/11558* (2013.01)

(58) Field of Classification Search
CPC ............ G11C 16/0491; G11C 16/0416; G11C 16/0425
USPC ............ 365/185.05, 185.06, 185.11, 185.13, 365/185.16, 63; 257/E27.103
See application file for complete search history.

(56) References Cited

U.S. PATENT DOCUMENTS 5,646,886 A * 7/1997 Brahmbhatt ....... G11C 16/0491
365/185.05
9,048,137 B2 6/2015 Wang

OTHER PUBLICATIONS

Ohsaki et al., "A Single Poly EEPROM Cell Structure for Use in Standard CMOS Processes", IEEE Journal of Solid State Circuits, Mar. 1994, pp. 311-316, vol. 29, No. 3.

* cited by examiner

*Primary Examiner* — Thong Q Le
(74) *Attorney, Agent, or Firm* — Muncy, Geissler, Olds & Lowe, P.C.

(57) ABSTRACT

Scalable Logic Gate Non-Volatile Memory (LGNVM) NOR-type arrays fabricated by the standard CMOS logic technologies have been applied for the embedded flash solutions in digital circuitries. To significantly reduce the memory array sizes from the previous fabrications, we have applied the topological regularity of memory cells in the arrays and a self-aligned etch process step to eliminate the gate end-caps in the memory areas. Without scarifying the memory array yields, the minimal unit cell size of 12 $F^2$ for the LGNVM NOR flash arrays can be achieved by this method, where F is the minimal feature size for a specific CMOS logic process technology node.

24 Claims, 24 Drawing Sheets

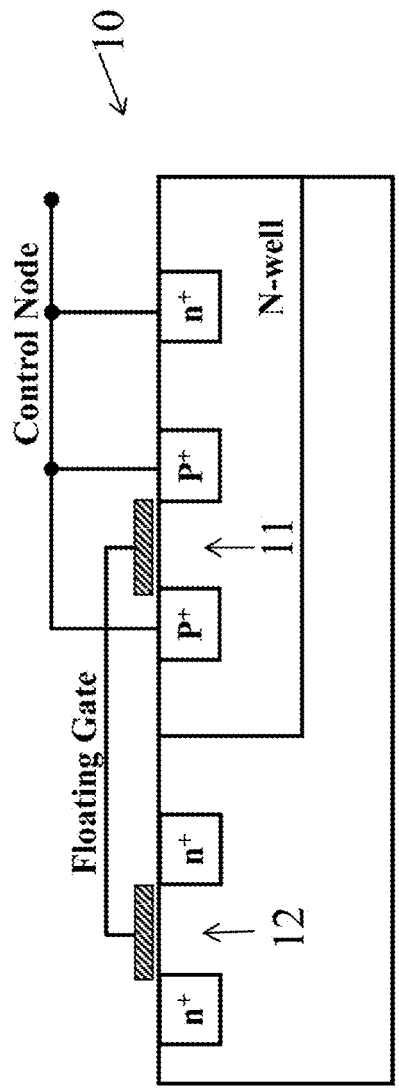
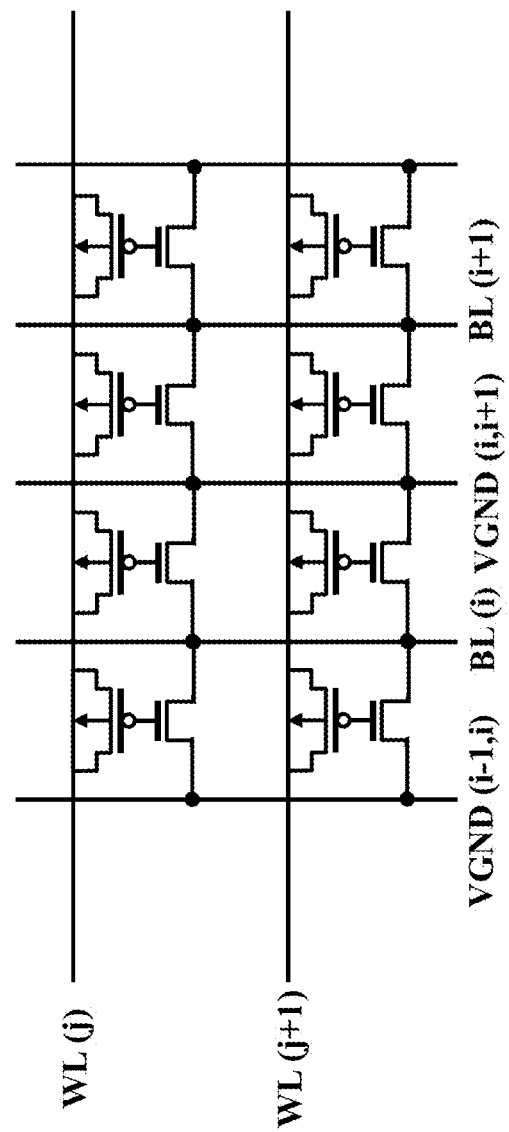
Fig. 1a (prior art)
Fig. 1b (prior art)

Fig. 4b (prior art)   With gate end-cap

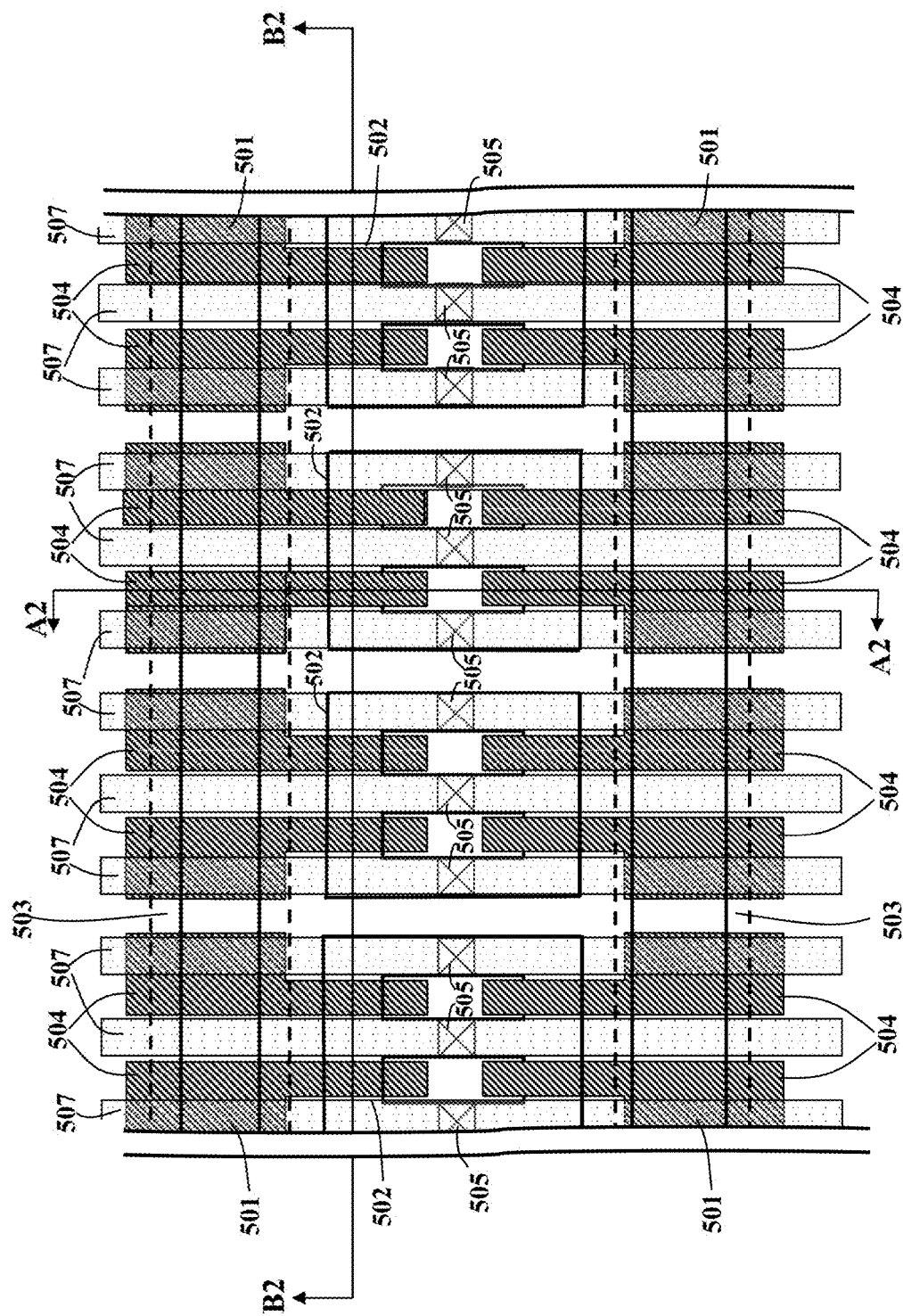
Fig. 5a (prior art)   With gate end-cap

Fig. 5b (prior art)   With gate end-cap

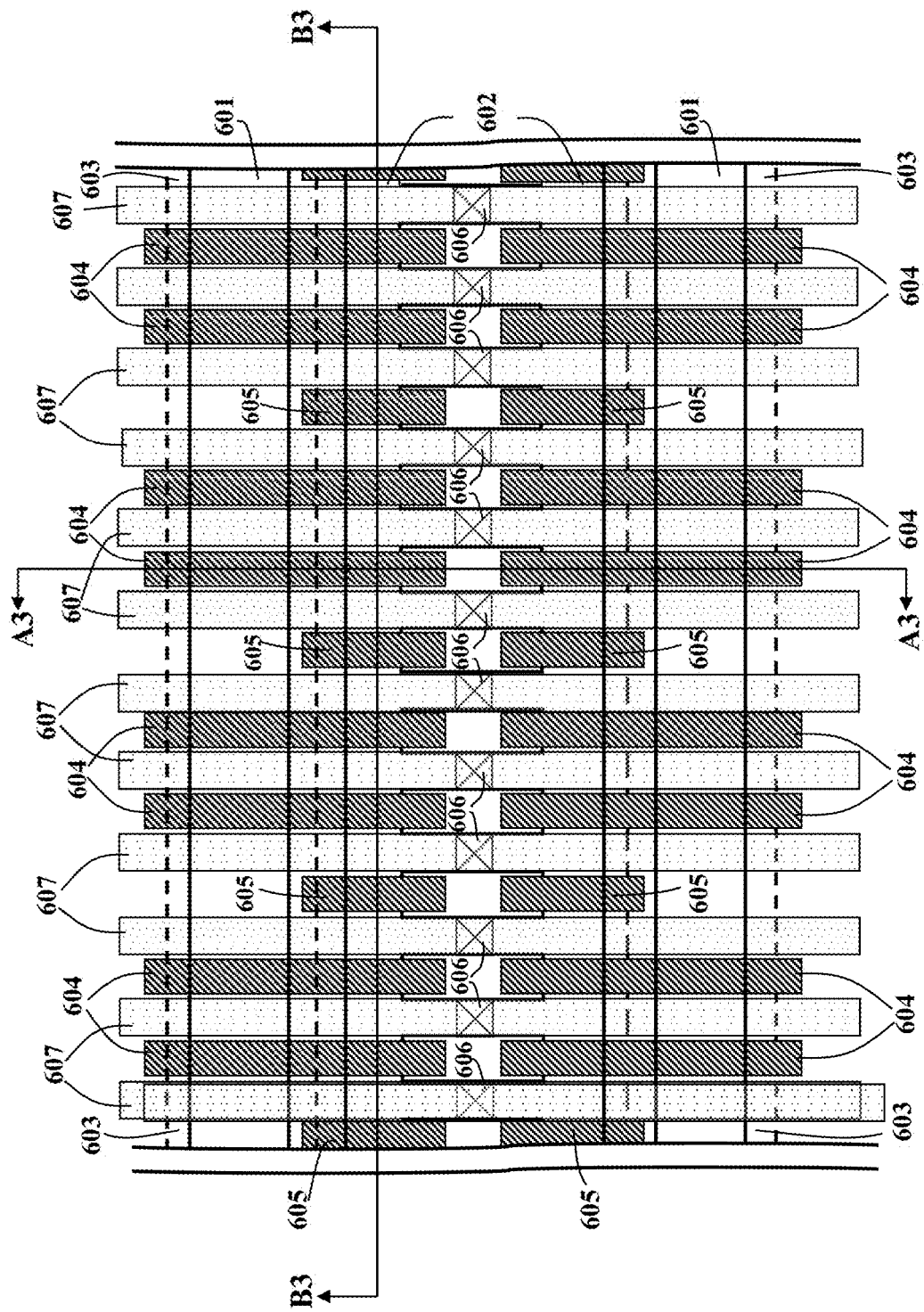
Fig. 6a (prior art)  With gate end-cap

Fig. 6b (prior art) With gate end-cap

Fig. 7b (prior art)  With gate end-cap

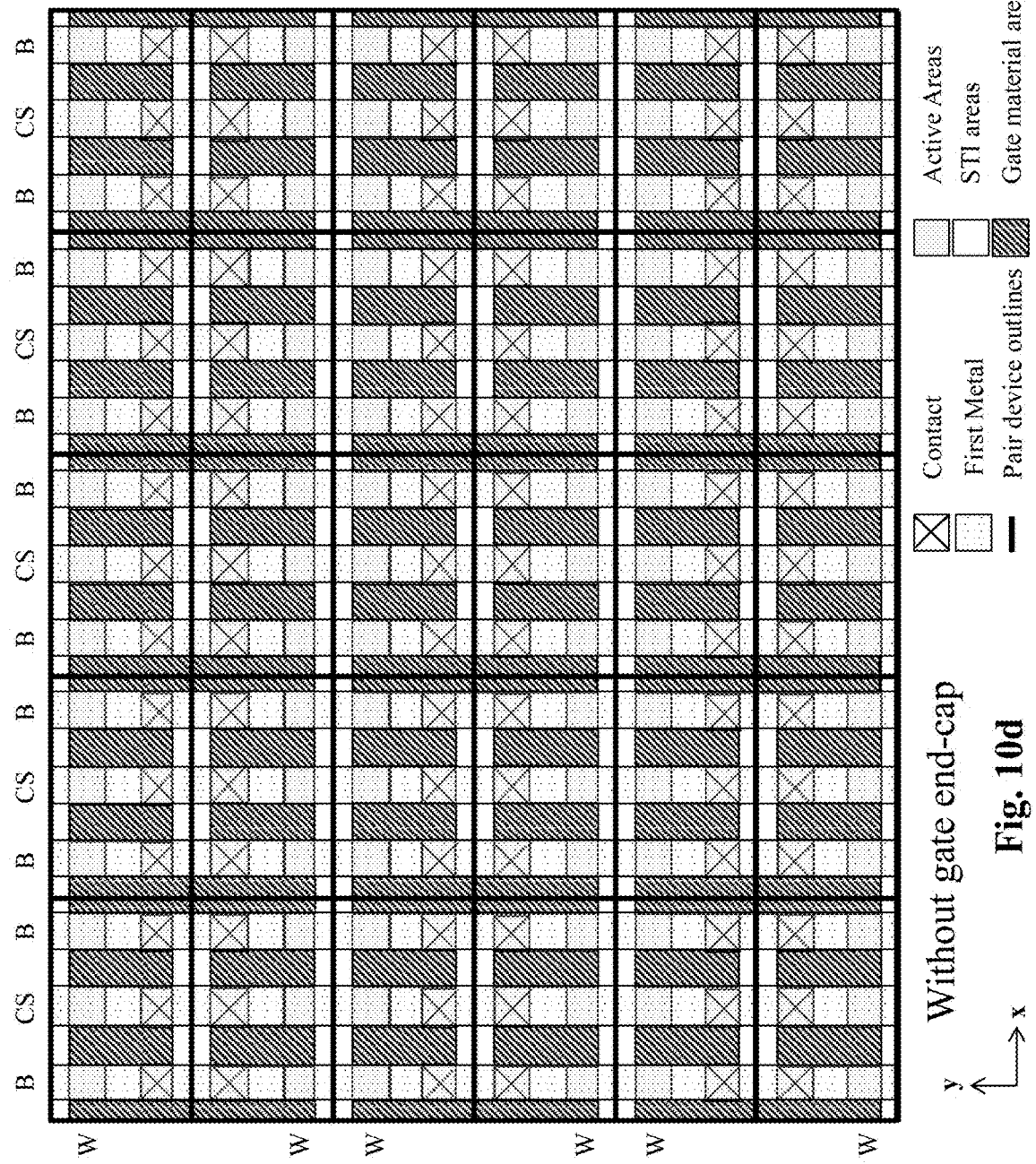
Fig. 10d Without gate end-cap

MEMORY CELL SIZE REDUCTION FOR SCALABLE LOGIC GATE NON-VOLATILE MEMORY ARRAYS

BACKGROUND OF THE INVENTION

Field of the Invention

The invention relates to a technology-node scalable semiconductor Non-Volatile Memory (NVM) array processed with the conventional Complementary Metal Oxide Semiconductor (CMOS) logic process technology. In particular, a plurality of memory cells in the flash arrays can be reduced to the minimal cell size of 12 $F^2$, where F is the minimal feature size for a specific CMOS logic process node.

Description of the Related Art

Complementary Metal-Oxide Semiconductor (CMOS) process has become the most popular fabrication process for Application Specific Integrated Circuit (ASIC). An ASIC contains the specific functionality of a device or a system on a single Integrated Circuit (IC) or a chip. In digital age, almost all electronic devices or equipment are controlled and operated by IC chips. Changes for the specific functionality or configuration are required for many various applications. For examples, the initial programming and configuring a microprocessor require a programmable non-volatile memory to store the programmed instructions and initial data. The non-volatile memory retains its stored digital information, even when the powers for the electronic systems are "off". The stored digital information or instructions can be recalled, when the electronic system are turned on. Furthermore, the programmable instructions and initial data shall be allowed to change any time without changing the hardware during developments. Those requirements for electronic systems are done by Electrically Erasable Programmable Read-Only Memory (EEPROM) devices. EEPROM is a semiconductor NVM device capable of being erased and programmed by applying electrical voltage biases to the electrodes of memory devices. EEPROM are usually operated cell-by-cell basis. Thus, EEPROM requires a MOSFET device to access the storing memory cell. In general, EEPROM are at least two-transistor (2T) memory cell (access transistor+storing transistor). Electrical Programmable Read-Only Memory (EPROM) is another kind of semiconductor NVM with a single unit of storing transistor (1T) without the access transistor. However, EPROM requires Ultra-Violate (UV) light for erase operation. In later development, EEPROM based on the single transistor EPROM (1T) array architecture has been specifically configured into flash EEPROM that may be electrically erased on a global basis, that is, page-by-page or sector-by-sector.

In the conventional EEPROM fabrication process, the control gates of EEPROM memory cells are fabricated above an isolated conductive layer so-called "floating gate" or a stack of dielectric layers like Oxide-Nitride-Oxide (ONO) for storing electrical charges on top of silicon channel surfaces. In contrast to the CMOS logic process broadly applied to most ASIC fabrications, only one conducting gate layer is fabricated for the control gates of logic MOSFET devices. The fabrication process for the extra charge storing layers requires several process steps such as film deposition, etching, and photolithography for patterning. These additional process steps result in fabrication cost increases, process complexity, circuit yield impact, and longer process time. Thus, EEPROM cells processed with no extra storage layer and compatible with CMOS baseline process are very desirable for embedded EEPROM ASICs.

The first single-poly floating gate EEPROM cell device processed with the conventional CMOS process was demonstrated and reported by Ohsaki et al. in 1994, IEEEE Journal of Solid-state Circuit, Vol. 29, No. 3, March 1994, pp. 311-316. As shown in FIG. 1a, the source, drain, and N-type well electrodes of a P-type MOSFET 11 in CMOS are connected altogether to form the control gate of the EEPROM device 10 and the gates of the CMOS without connecting to any external electrodes form the floating gate of the EEPROM device 10 for storing charges. The source, drain, and substrate electrodes of the N-type MOSFET 12 in the CMOS form the source, drain and substrate electrodes of the EEPROM device 10, respectively. However, the array architecture of the original devices shown in FIG. 1b suffers the drawbacks of programming/read disturbances and poor endurance cycling. To resolve the severe programming/read disturbances and poor endurance, we have applied the paired-cell or staggered-cell configurations for constructing the Scalable Gate Logic NVM (SGLNVM) arrays as disclosed in U.S. Pat. No. 9,048,137 B2 (the disclosure of which is incorporated herein by reference in its entirety). By applying the innovative configurations of the flash memory arrays, we have not only resolved the performance issues but also scaled the SGLNVM arrays to the gate length of 32 nm fabricated by foundry's standard 40 nm CMOS logic technology nodes as the SEM (Scanning Electron Microscopy) picture shown in FIG. 2.

Not only have we demonstrated the scalability of the SGLNVM arrays in three different standard CMOS logic technology nodes (110 nm, 55 nm, and 40 nm), we have also shrunk the memory cell sizes for each CMOS process technology node to the minimal cell sizes for higher memory densities and lower chip area costs. Since the layout drawings for logic gates and flip-flops in digital circuit libraries for ASIC chips are less "regular" compared with those in memory arrays, the topological layout rules in CMOS logic process are usually set to be loosen to allow the process tolerance for the variations of shapes and orientations of various MOSFET devices. For example, the widths and lengths of MOS devices for different logic function gates, buffers, and flip-flops in digital circuit libraries are varied to minimize the gate-stage delay for fast logic operations, while the rules of the smallest unit cell size of memory device(s) are always applied repetitively to form the memory arrays.

In the fabrication of CMOS logic process, the gate end-cap, which is the gate extension over the active width of a MOSFET device, is necessary to create the process margins for MOSFET device yields. The extended end-cap is then applied to compensate for the imperfections of fabrication process such as etch micro-loading effect, photo-lithographic proximity effect and misalignment. As illustrated in FIG. 3, the extended gate y (end-cap) of a MOSFET device can be compensated for the misalignment "Δy" between the active-area mask and the gate mask. Depending on the process capability of wafer fabrication, the gate end-cap rule is defined in the mask drawing rules of the CMOS logic technology process. Since the gate end-cap rule is significantly long and somehow unscalable in CMOS logic technology nodes, applying the same gate end-cap rule for the digital circuit library will increase the areas of NVM arrays from the extended gate end-cap length and the required gate spacing.

As disclosed in U.S. Pat. No. 9,048,137 B2, Scalable Gate Logic Non-Volatile Memory (SGLNVM) devices are fabricated with standard CMOS process. The gate length of the floating gate of SGLNVM is defined by the minimal gate length of a logic process technology node. The minimal gate length of a logic process node is the feature of the process technology denoted by "F". The minimal gate width of a MOSFET device is usually given by the minimal active area width of the process technology node. Thus the minimal floating gate length and minimal active width of SGLNVM form the minimal channel length and width of the floating gate Metal-Oxide-Semiconductor Field Effect Transistor (MOSFET). The floating gate with the minimal length floating gate extends over a silicon active area forming a capacitive coupling between the floating gate and the control gate embedded in silicon substrate (well) by an insulation dielectric 419/519/6191719. The embedded control gate 420/520/620/720 is formed by a shallow semiconductor type opposite to the type of the silicon substrate (well). The shallow control gate semiconductors are done by N-type ion implantation in P-type substrate or by P-type ion implantation in N-type well such that the depths of the junctions 408/508/608/708 are above the bottom of the field isolation 411/511/611/711. The ion implantation for N-type SGL-NVM can be incorporated in the threshold voltage ion implantation for the P-type MOSFET using the same masking layer in the conventional CMOS process. The ion implantation for P-type SGLNVM can be incorporated in the threshold voltage ion implantation for the N-type MOSFET using the same masking layer in the conventional CMOS process.

As shown in FIG. 4d, a plurality of SGLNVM devices are configured into a NOR-type flash array where a pair PP of NVM devices with the sharing source electrodes connected to a common ground line and the two drain electrodes connected to two separate bitlines. The pairs of the NOR-type SGLNVM cells are physically separated and electrically isolated by field oxides 411/511 or the opposite type of semiconductor under the dummy floating gates 605/705.

In the examples of FIGS. 4a~4d and 5a~5d (corresponding to FIGS. 8a~8d and 9a~9d in U.S. Pat. No. 9,048,137 B2), field oxides 411/511 are applied to separate pairs of the N-type and P-type NOR SGNVM cell devices in the flash array. FIG. 4a is a top view of the N-type SGLNVM flash array disclosed in U.S. Pat. No. 9,048,137 B2. FIG. 4b and FIG. 4c are the cross-section view of cut "A1" and "B1" in FIG. 4a, respectively. FIG. 4d shows the schematic diagram of a m×n N-type SGLNVM flash array of FIG. 4a. FIG. 5a shows the top view of the P-type SGLNVM flash array disclosed in U.S. Pat. No. 9,048,137 B2. FIG. 5b and FIG. 5c are the cross section view of cut "A2" and "B2" in FIG. 5a, respectively. FIG. 5d shows the schematic diagram of a m×n P-type SGLNVM flash array of FIG. 5a.

The two active areas 401/501 in the shape of two rows defining the wordline areas and a row of active areas 402/502 in the shape of rectangles defining source/drain electrode areas are processed by Shallow Trench Isolation (STI) module in the conventional CMOS process. The width of areas 402/502 is preferred drawn to be the minimal width of the process capability to minimize the device size. As in the conventional CMOS process, a series of N-type well and P-type well implants are performed. Areas 403 are the open areas to receive shallow N-type implants such that the depths of the shallow n/p junctions 408 formed with the P-type substrate 412 are above the bottom of STI 411, while areas 503 are the open areas to receive shallow P-type implants such that the depths of the shallow p/n junctions 508 formed with the N-type wells 512 are above the bottom of STI 511. Depending on the detailed CMOS process and the requirement of the wordline (linking NVM cells' control gates 420/520) resistance in the array, the N-type implants can be incorporated with the threshold voltage and punch-through implants for P-type MOSFETs, and the P-type implants can be incorporated with the threshold voltage and punch-through implants for N-type MOSFETs in the conventional CMOS process. After well implants for both P-type and N-type MOSFETs, different thickness gate oxides including tunneling oxide 409/509 and isolation dielectric 419/519 are grown and a poly-crystalline silicon film are deposited, patterned, and etched to form the floating gates 404/504 in the array, and the gates of other regular MOSFETs. The widths of the floating gates 404/504 are preferred to be the minimal width of the process capability to minimize the device size. The floating gates 404/504 overlap the active areas 402/502 to form the minimal channel lengths and widths 415/515 of floating gate MOSFETs. Two floating gate MOSFETs are paired to share the common source electrodes 414/514. The field oxides 411/511 extending parallel to the bit lines and formed between the active areas 402/502 are used to separate the neighboring drain electrodes 413/513 as shown in FIGS. 4c and 5c. Lightly Doped Drain (LDD) and pocket implants are then performed before the nitride spacer 410/510 formation. After receiving high dosage N-type source/drain electrode implant, thermal activation, and salicide formation, the front-end process of the N-type SGLNVM device array configured with multiple NOR-pairs separated by field oxides 411 is complete; after receiving high dosage P-type source/drain electrode implant, thermal activation, and salicide formation, the front-end process of the P-type SGL-NVM device array configured with multiple NOR-pairs separated by field oxides 511 is complete. The source/drain electrodes 414/514 and 413/513 of SGLNVM devices are connected to metal lines 406/506 through contacts 405/505. The correspondent wordlines ($W_i$), common source lines (G), and bitlines ($B_j$) for the N-type SGLNVM flash array configured with multiple NOR-pairs separated by field oxides 411 in FIG. 4a are shown in the schematic in FIG. 4d. The correspondent wordlines ($W_i$), common source lines (V), and bitlines ($B_j$) for the P-type SGLNVM flash array configured with multiple NOR-pairs separated by field oxides 511 in FIG. 5a are shown in the schematic of FIG. 5d.

In the examples of FIGS. 6a~6d and 7a~7d (corresponding to FIGS. 2a~2d and 5a~5d in U.S. Pat. No. 9,048,137 B2), dummy floating gates 605 and 705 are respectively applied to separate pairs of N-type and P-type NOR SGL-NVM cell devices in the flash array. FIG. 6a is the top view of the N-type NOR SGLNVM flash array disclosed in U.S. Pat. No. 9,048,137 B2. FIG. 6b and FIG. 6c are the cross-section view of cut "A3" and "B3" in FIG. 6a, respectively. FIG. 6d shows the schematic diagram of a m×n N-type SGLNVM flash array of FIG. 6a. FIG. 7a shows the top view of the P-type SGLNVM flash array disclosed in U.S. Pat. No. 9,048,137 B2. FIG. 7b and FIG. 7c are the cross section view of cut "A4" and "B4" in FIG. 7a, respectively. FIG. 7d shows the schematic diagram of a m×n P-type SGLNVM flash array of FIG. 7a.

Two active areas 601/701 and an active area 602/702 in the shape of three rows defining the wordline areas and source/drain electrode areas respectively are processed by Shallow Trench Isolation (STI) module in the conventional CMOS process. The width of areas 602/702 is preferred drawn to be the minimal width of the process capability to minimize the device size. As in the conventional CMOS process, a series of N-type well and P-type well implants are performed. Areas 603 are the open areas to receive shallow N-type implants such that the depths of the shallow n/p junction 608 formed with the P-type substrate 612 are above the bottom of STI 611, while areas 703 are the open areas to receive shallow P-type implants such that the depths of the shallow p/n junctions 708 formed with the N-type wells 712 are above the bottom of STI 711. Depending on the detailed CMOS process and the requirement for the wordline (linked NVM cells' control gates 620/720) resistance in the array, the N-type implants can be incorporated with the threshold voltage and punch-through implants for P-type MOSFETs, and the P-type implants can be incorporated with the threshold voltage and punch-through implants for N-type MOSFETs in the conventional CMOS process. After well implants for both P-type and N-type MOSFETs, different thickness gate oxides including tunneling oxide 609/709 and isolation dielectric 619/719 are grown and a poly-crystalline silicon film are deposited, patterned, and etched to form the floating gates 604/605/704/705 in the array, and the gates of other regular MOSFETs. The widths of the floating gates 604/704 are preferred to be the minimal width of the process capability to minimize the device size. The floating gates 604/704 overlap the active areas 602/702 to form the minimal channel lengths and widths 615/715 of floating gate MOSFETs. Two floating gate MOSFETs are paired to share the common source electrodes 614/714. The dummy floating gates 605 overlap the active areas 602 to form the P-type channel stop areas 616 to separate the neighboring N-type drain electrodes 613 while the dummy floating gates 705 overlapping the active areas 702 to form the N-type channel stop areas 716 to separate the neighboring P-type drain electrodes 713. Lightly Doped Drain (LDD) and pocket implants are then performed before the nitride spacer 610/710 formation. After receiving high dosage N-type source/drain electrode implant, thermal activation, and salicide formation, the front-end process of the N-type SGLNVM device array is complete; after receiving high dosage P-type source/drain electrode implant, thermal activation, and salicide formation, the front-end process of the P-type SGLNVM device array is complete. The source/drain electrodes 614/714 and 613/713 of SGLNVM devices are connected to metal lines 607/707 through contacts 606/706. The correspondent wordlines, common source lines, and bitlines for the N-type SGLNVM flash array in FIG. 6a are shown in the m×n schematic in FIG. 6d. The correspondent wordlines, common source lines, and bitlines for the P-type SGLNVM flash array in FIG. 7a are shown in the m×n schematic in FIG. 7d.

Please note that for SGLNVM device array in U.S. Pat. No. 9,048,137 B2, (1) the floating gates 404/504/604/704 have end-caps; (2) the field trench isolations and the floating gates in the array areas are formed separately by the STI module and a gate formation process module respectively in the CMOS logic process.

In this invention, without scarifying the device yields, we have applied the principle of topological regularity of the memory cells and one self-aligned etch process step to reduce the unit cell size in the LGNVM NOR flash arrays of the invention by eliminating the gate end-cap in the memory array. The cell size of 12 $F^2$ can be then achieved, where F is the minimal feature size for a specific CMOS logic process technology node. Since the LGNVM NOR flash arrays of the invention have the extra process cost savings for the omission of the storage stacks (floating-gate stack or charge-trap dielectric stack) with the memory sizes compatible with the cell sizes (9~10 $F^2$) of the conventional stacked NOR flash arrays, the LGNVM NOR flash arrays of the invention are the most cost-effective embedded flash solutions for the CMOS digital circuitries. Furthermore, since the conventional NOR flash arrays have hit the gate-length scaling obstacle below 110 nm node due to device punch-through issue caused by the conventional Channel Hot Electron Injection (CHEI) programming, the scalable LGNVM NOR flash arrays of the invention fabricated with conventional CMOS logic processes is the unique embedded flash solution in digital circuitries for the advanced CMOS logic technology nodes (nodes below 110 nm).

SUMMARY OF THE INVENTION

To illustrate the objective of cell size reduction (50% area reduction), we show (a) the top-view of SGLNVM cell arrays (disclosed in U.S. Pat. No. 9,048,137 B2) for gate end-cap extension of 2 F with unit cell size of 24 $F^2$ and (b) the top-view of LGNVM cell arrays for no gate end-cap with unit cell size of 12 $F^2$, respectively in FIGS. 8a and 8b. In FIG. 8a, the pairs 810 of SGLNVM cell devices are configured as the followings: the control gates 811 in one row connect altogether to form a horizontal wordline; the two floating gates 812 for the charge storage extend 2 F length from the overlapped control gate areas and the device channel areas 813; the two drain electrodes 814 and 815 are connected to the two vertical metal bitlines (not shown); the common source electrode 816 is connected to a common vertical metal source line (not shown). In the SGLNVM array in FIG. 8a, the pairs of SGLNVM cell devices are separated by Shallow Trench Isolation (STI) along the x-direction, while the cell boundaries 831 along the y-direction are separated by the two end-cap lengths plus the gate spacing.

In FIG. 8b, the pair 820 of LGNVM cell devices of the invention are configured as the followings: the control gates 821 in one row connect altogether to form a horizontal wordline; the floating gates 822 with zero extension from the overlapped control gate areas and the device channel areas 823; the two drain electrodes 824 and 825 are connected to the two vertical metal bitlines (not shown); the common source electrode 826 is connected to a common vertical metal source line (not shown). In the LGNVM array in FIG. 8b, the pairs 820 of LGNVM cell devices are separated by Shallow Trench Isolation (STI) along the x-direction, while the cell boundaries 832 along the y-direction are separated by the minimum spacing between the active areas.

To ensure the floating gate and the active area width are seamless aligned, we apply one self-aligned etch process step to form the floating gate with zero end-cap and field isolation trenches at the y-direction cell boundary regions 832 in the LGNVM cell arrays in FIG. 8b. In contrast to the previous fabrication process that the field trench isolations and the floating gates with end-cap extensions in the array areas for the SGLNVM cell arrays in FIG. 8a are formed separately by the STI process module and a gate formation process module respectively in the CMOS logic process, the final formations of the trench isolations and the floating gates with zero end-cap are completed with the added self-aligned etch process to separate the memory cells along the y-direction of the LGNVM arrays in FIG. 8b. The self-aligned etch process module is set up to etch through the gate material, tunneling oxide/coupling dielectric and to a depth of silicon substrate for the y-direction cell boundary trenches.

BRIEF DESCRIPTION OF THE DRAWINGS

For a better understanding of the present invention and to show how it may be carried into effect, reference will now be made to the following drawings, which show the preferred embodiments of the present invention, in which:

FIG. 1a shows the cross section of original single-poly floating gate NVM device.

FIG. 1b shows the schematic of single-poly floating NVM array by Ohsaki et al.

FIG. 4b and FIG. 4c are the cross-section view of cut "A1" and "B1" in FIG. 4a, respectively.

FIG. 4d shows the schematic diagram of a m×n N-type SGLNVM flash array of FIG. 4a.

FIG. 5a shows the top view of the P-type SGLNVM flash array disclosed in U.S. Pat. No. 9,048,137 B2.

FIG. 5b and FIG. 5c are the cross section view of cut "A2" and "B2" in FIG. 5a, respectively.

FIG. 5d shows the schematic diagram of a m×n P-type SGLNVM flash array of FIG. 5a.

FIG. 6a is the top view of the N-type NOR SGLNVM flash array disclosed in U.S. Pat. No. 9,048,137 B2.

FIG. 6b and FIG. 6c are the cross-section view of cut "A3" and "B3" in FIG. 6a, respectively.

FIG. 6d shows the schematic diagram of a m×n N-type SGLNVM flash array of FIG. 6a.

FIG. 7b and FIG. 7c are the cross section view of cut "A4" and "B4" in FIG. 7a, respectively.

FIG. 7d shows the schematic diagram of a m×n P-type SGLNVM flash array of FIG. 7a.

FIG. 10d shows the LGNVM NOR array after first metal process according to the second embodiment of the invention.

DETAILED DESCRIPTION OF THE INVENTION

The following detailed description is meant to be illustrative only and not limiting. It is to be understood that other embodiment may be utilized and structural changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 2:
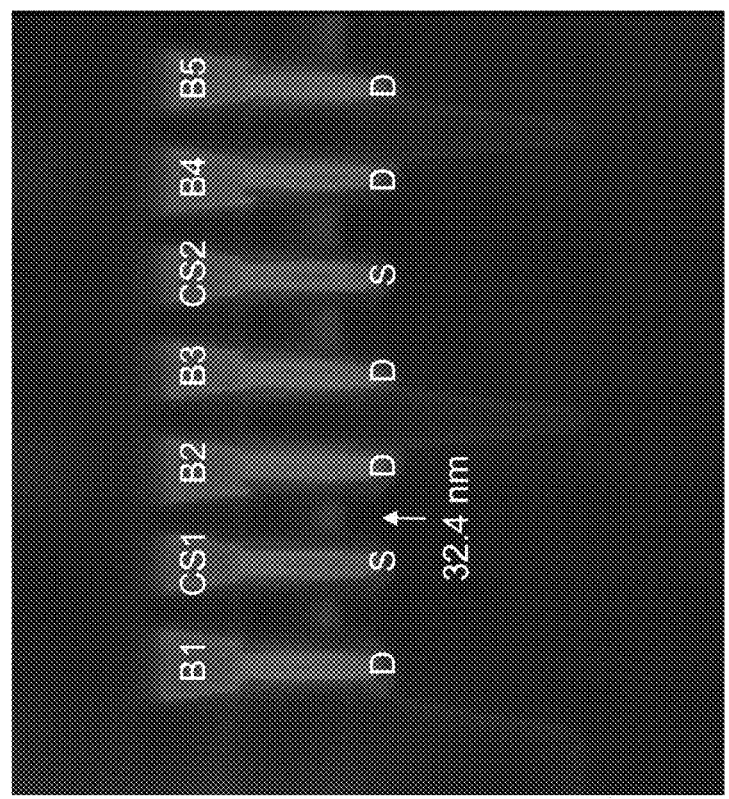
FIG. 2 shows the SEM picture of SGLNVM device with gate length of 32 nm.
Figure 3:
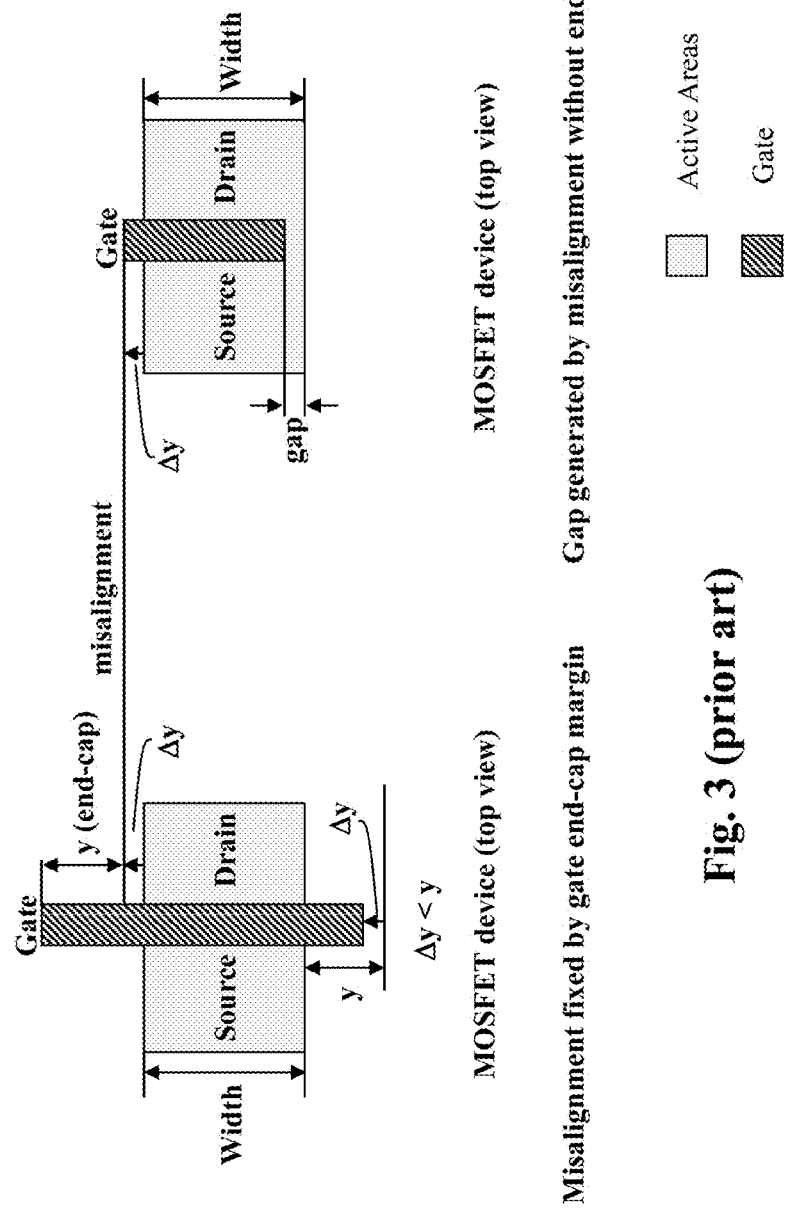
FIG. 3 illustrates that the extended gate end-cap length can resolve the fetal MOSFET device failures caused by the misalignment between active area mask and gate mask.
Figure 4A:
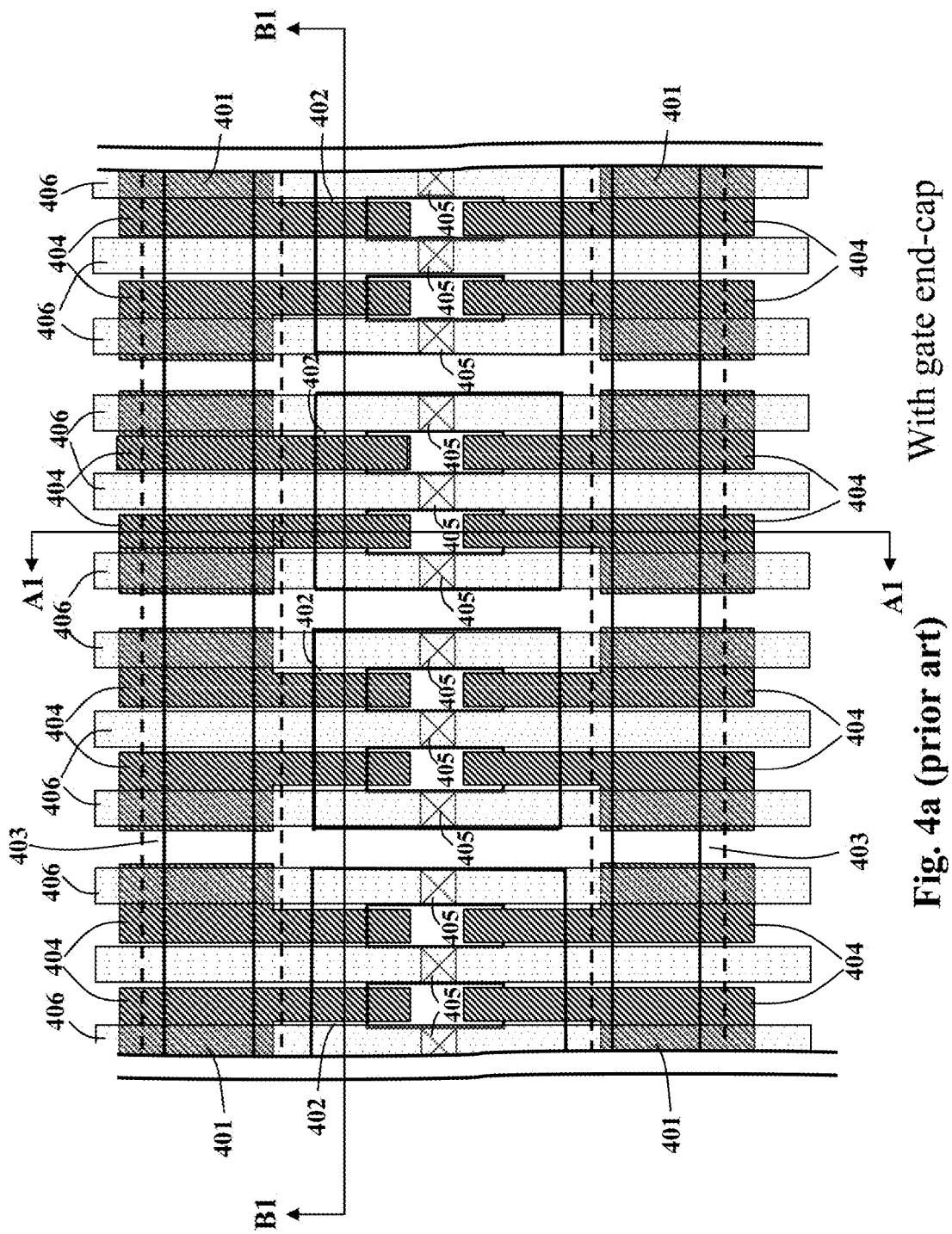
FIG. 4a is a top view of the N-type SGLNVM flash array disclosed in U.S. Pat. No. 9,048,137 B2.
Figure 4C:
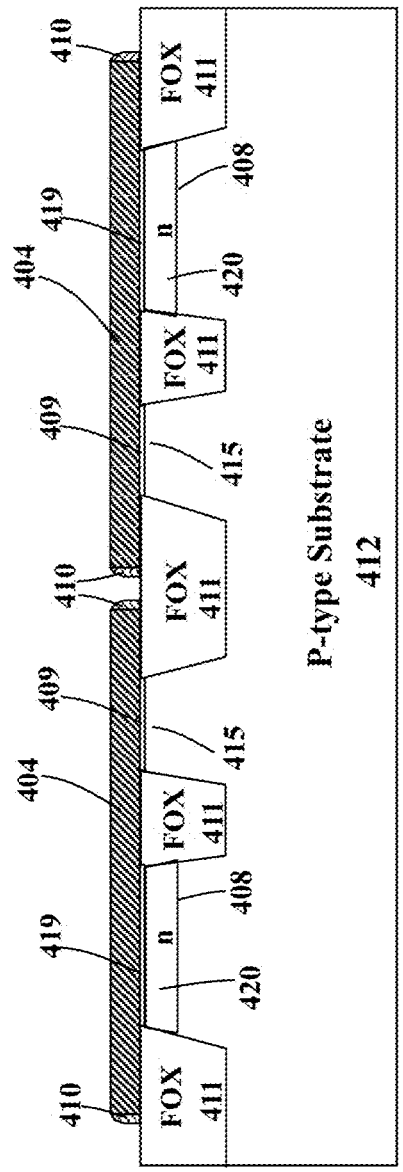
Figure 4C:
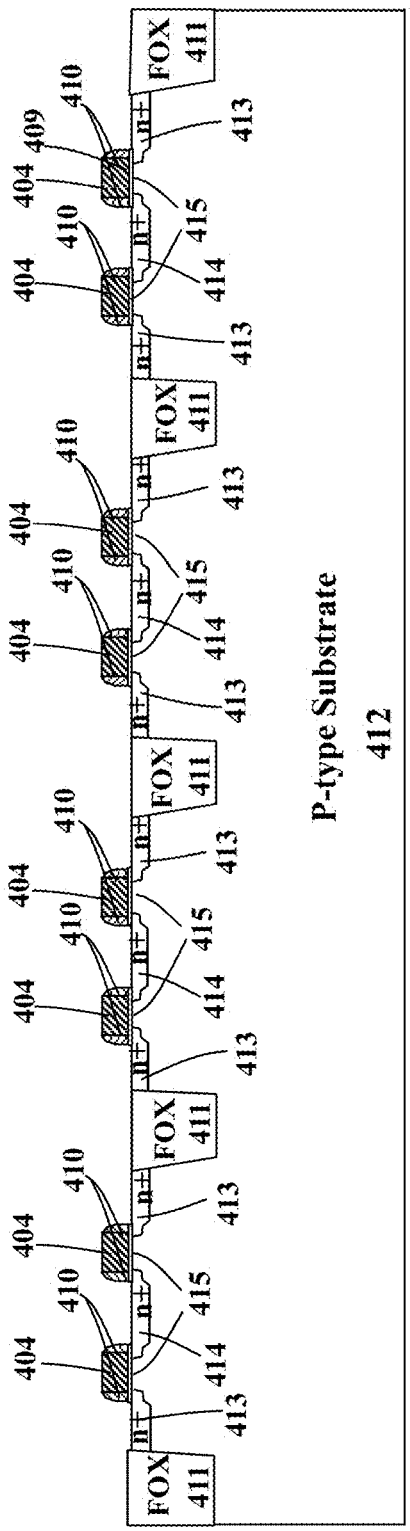
Figure 4D:
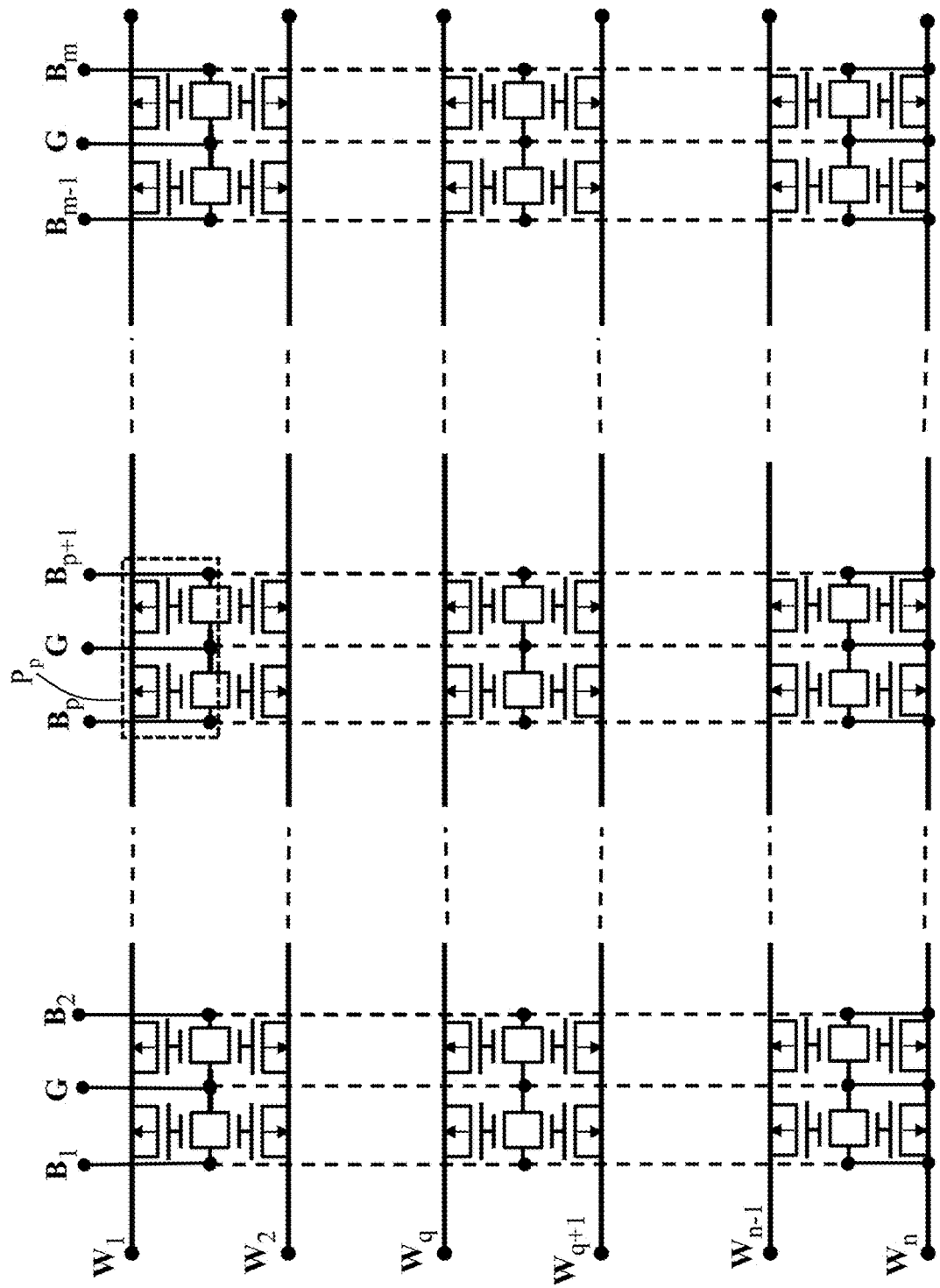
Figure 5C:
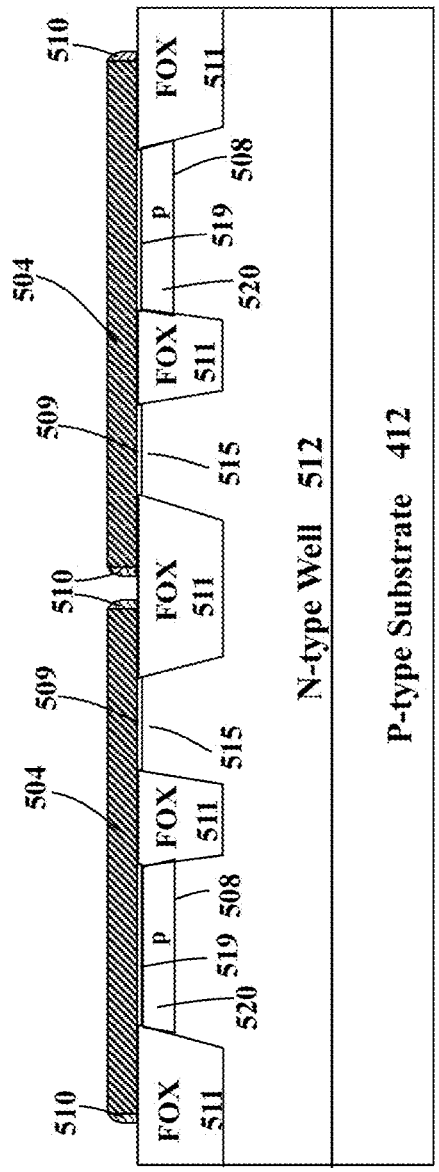
Figure 5C:
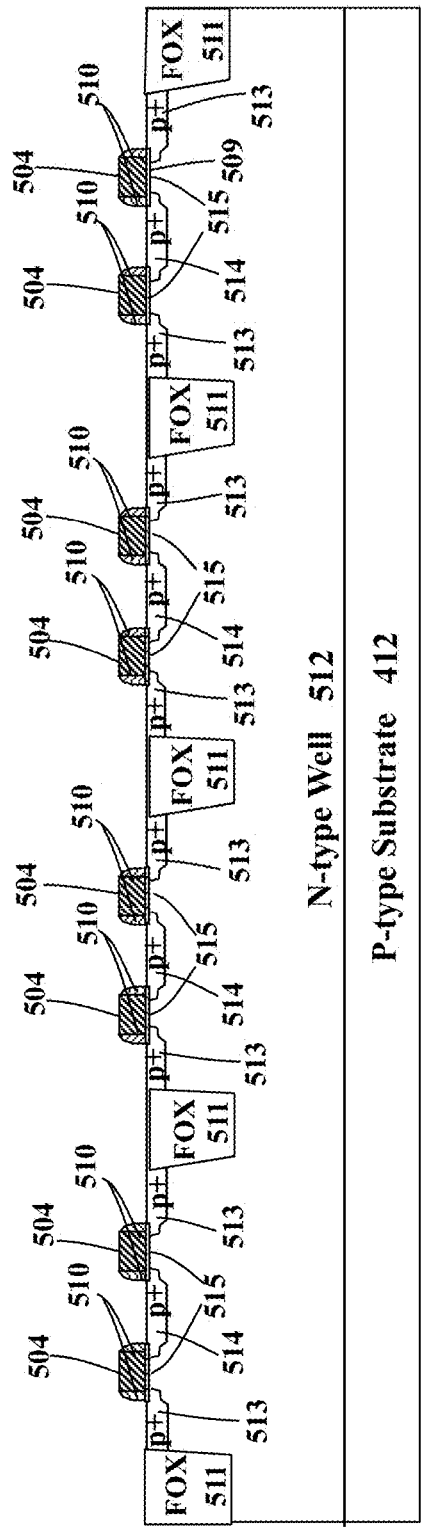
Figure 5D:
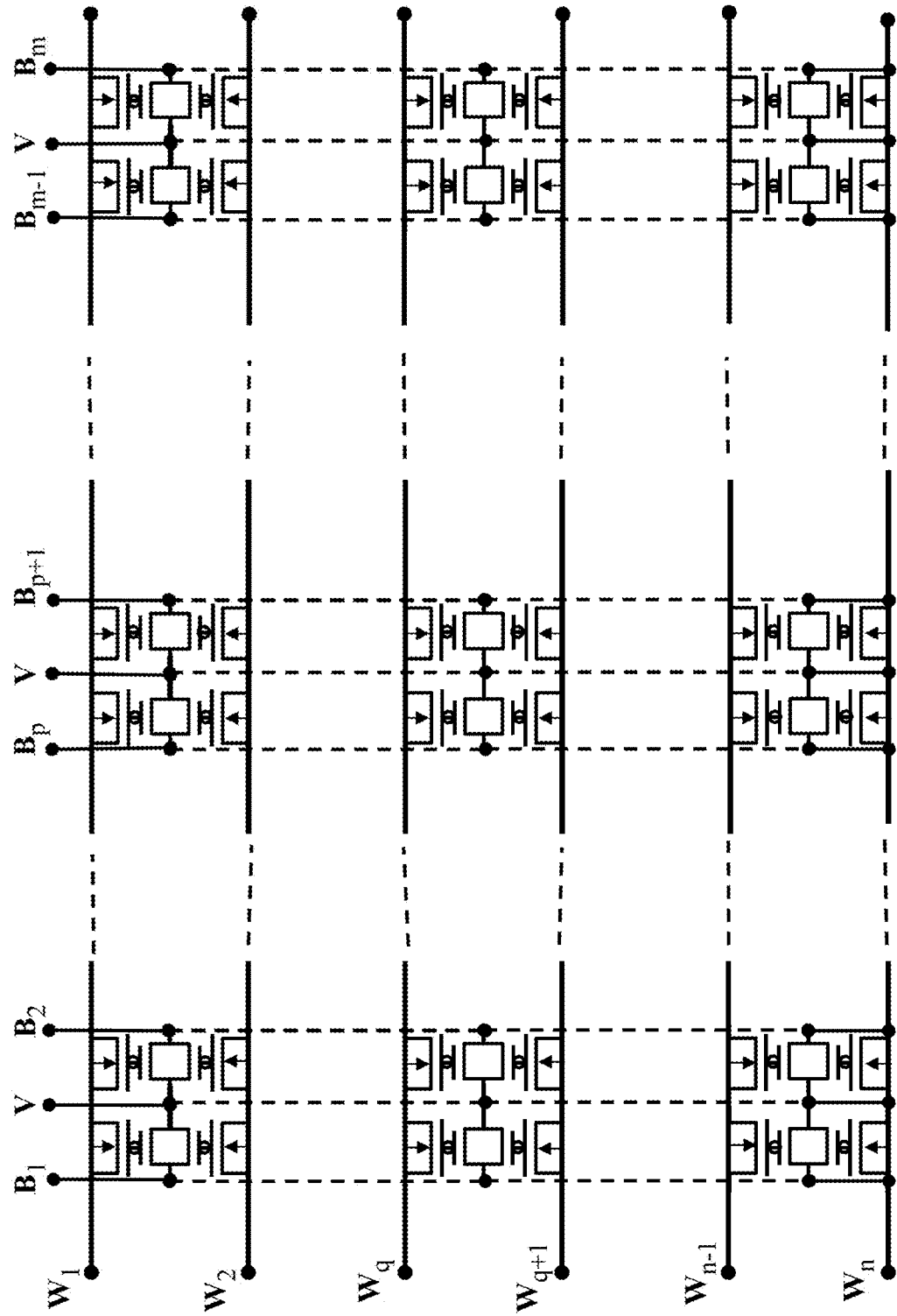
Figure 9A:
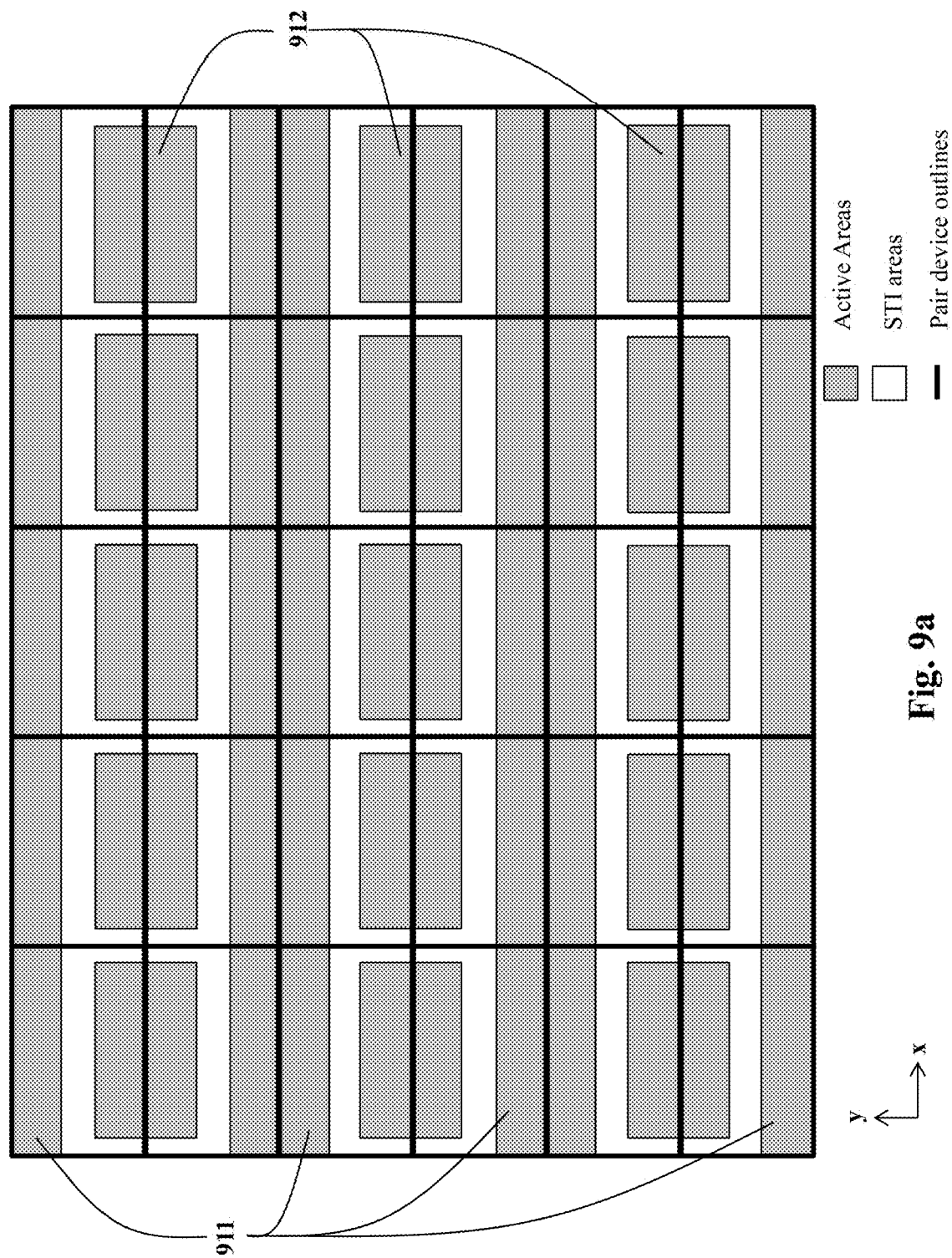
FIG. 9a shows the active area patterns in the memory arrays after STI process according to a first embodiment of the invention.
Figure 9B:
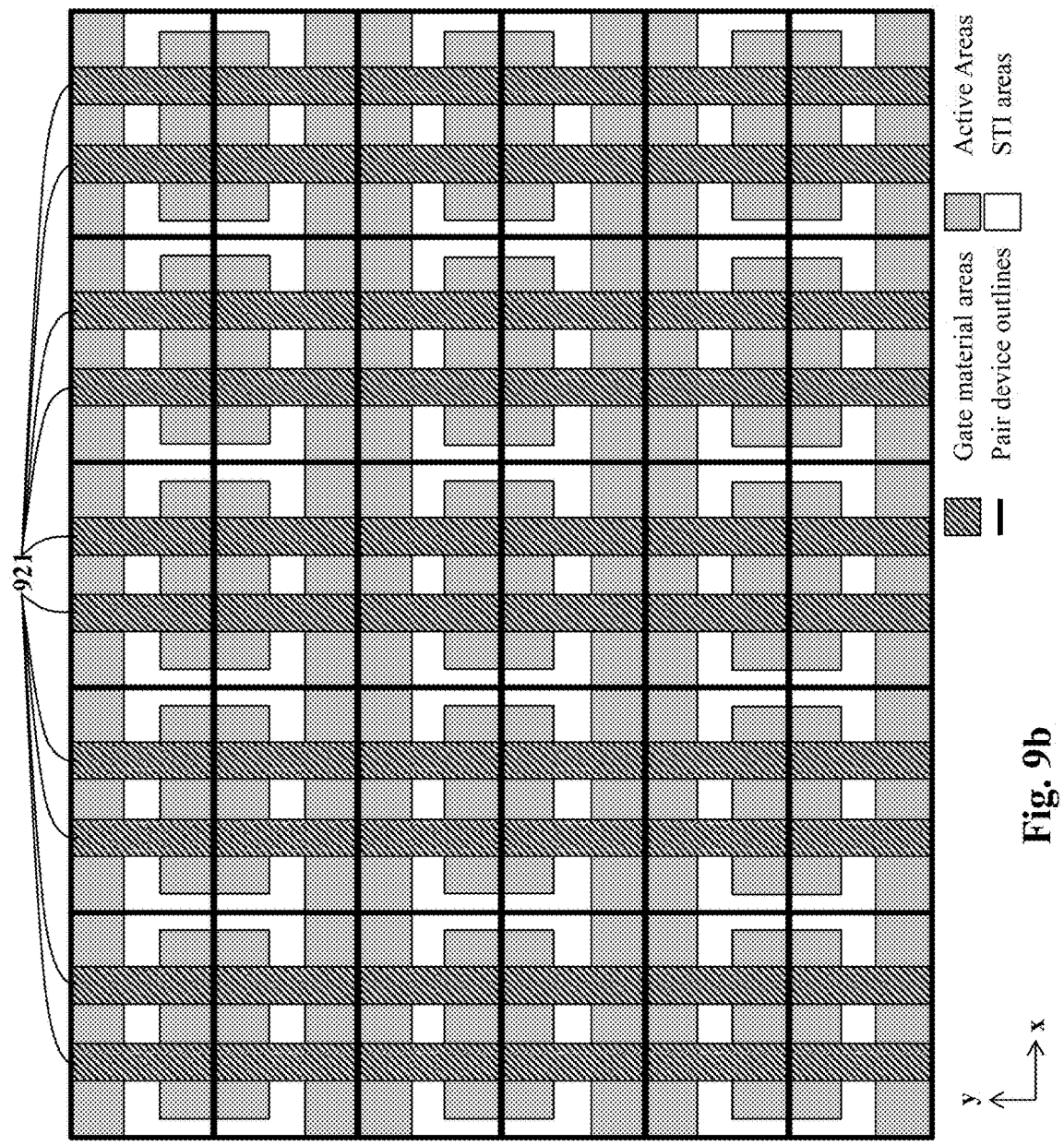
FIG. 9b shows the active areas and gate patterns in the memory arrays after gate formation process according to the first embodiment of the invention.

For one embodiment of this invention, field oxide isolations created by Shallow Trench Isolation (STI) process module (corresponding to FOX 411/511 in FIGS. 4c/5c) is applied to separate LGNVM device pairs along the x-direction in the memory arrays. In this embodiment, a self-aligned etch process module is applied to simultaneously form the floating gate with zero end-cap and field isolation trenches at the y-direction cell boundary regions in the LGNVM cell arrays; besides, the rest of the fabrication process and the schematic diagram of the invention are the same as the descriptions of FIGS. 4a~4d and 5a~5d, unless otherwise indicated herein or clearly contradicted by context. The description for the same portions of the fabrication process and the schematic diagram is omitted herein. The well ion implantations for forming the MOSFET devices' bodies usually start in the beginning of CMOS logic process technologies. The STI process module follows after well ion implantations. Since the common STI process module in CMOS logic process is well-known in the art, we will not address the STI process module in details. The topologic view of the LGNVM array (multiple active area strips and multiple active area rectangles) after STI module process is shown in FIG. 9a. In order to better view the LGNVM array, we have also drawn the memory cell boundary outlines of the LGNVM pair devices in the following figures. In FIG. 9b, each active area strip 911 contains two control gate areas (upper wordline and lower wordline) without being separated by STI process and each active area rectangle 912 contains two LGNVM source/drain active areas (upper cells and lower cells) without STI separation. Several ion implantations for MOSFET device threshold voltages and LGNVM control gates (corresponding to control gates 420/520) are performed after STI module. Gate oxides (corresponding to tunneling oxide 409/509 and isolation dielectric 419/519) are then grown for different MOSFET devices. The gate formation process module includes a poly-silicon film deposited and etched to form the MOSFET device gates follows after gate oxides formation.

Figure 9C:
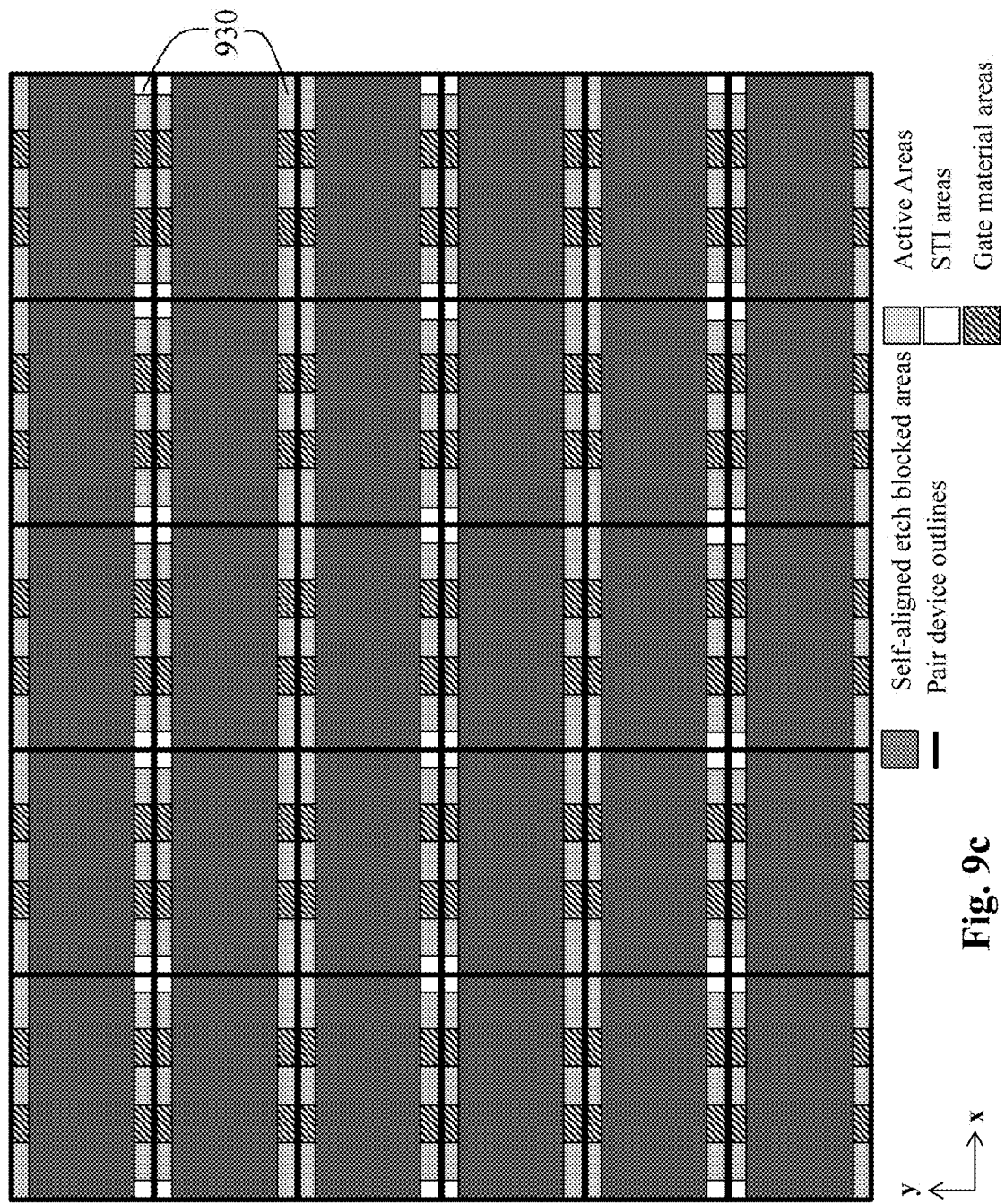
FIG. 9c shows the added mask patterns in the memory arrays for the self-aligned etch process module according to the first embodiment of the invention.
Figure 9D:
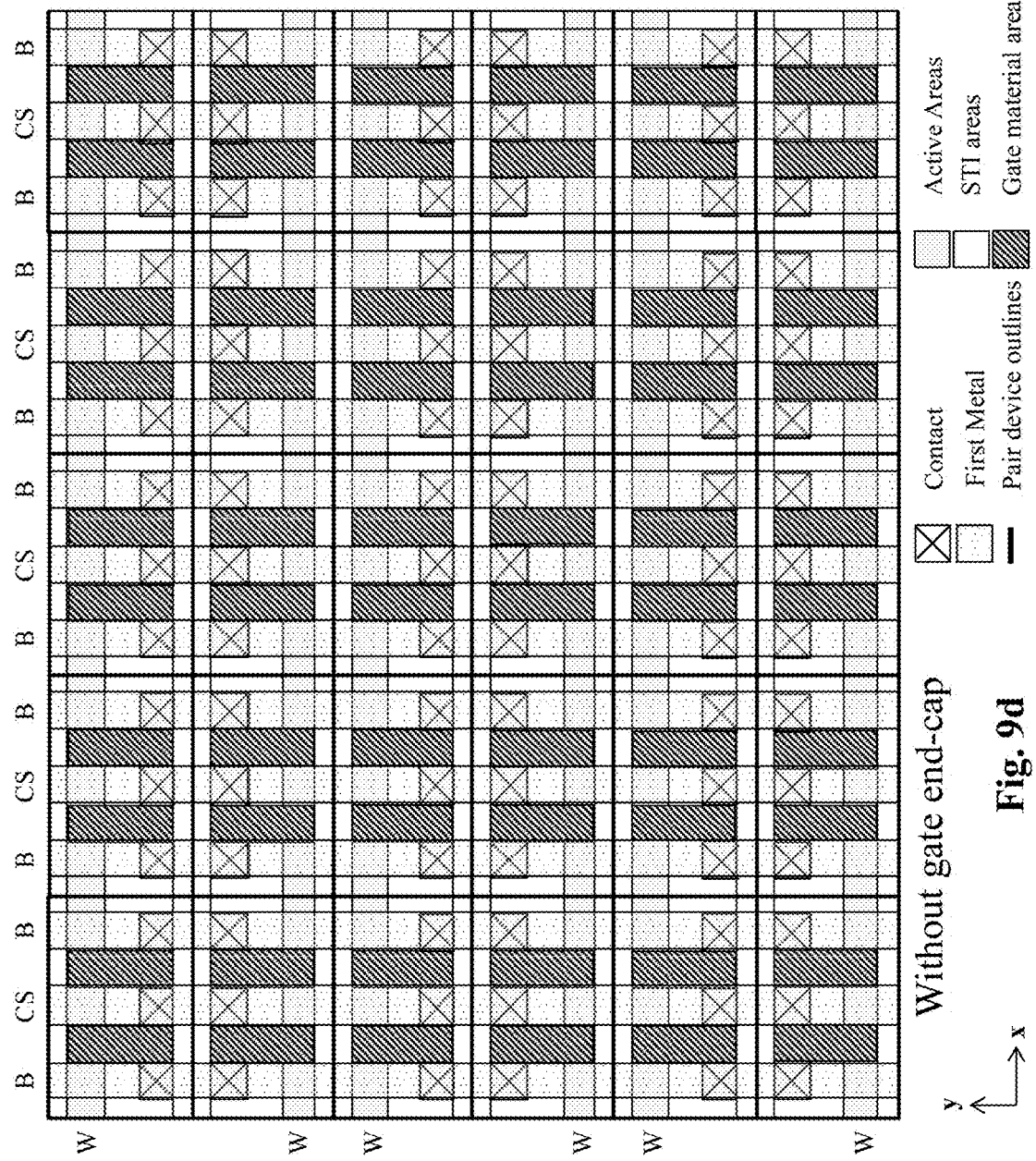
FIG. 9d shows the LGNVM NOR array after first metal process according to the first embodiment of the invention.

After the device gate formation, the poly-silicon floating gates in the LGNVM array are shown in FIG. 9b. The parallel vertical poly-silicon strips 921 are not separated for the floating gates of the individual memory cells in the LGNVM array areas. The separation of memory cells along the y-direction of the array is done by applying a mask with the blocking areas including the patterns shown in FIG. 9c for the memory arrays and the whole areas outside the memory arrays to protect the device patterns from etching reactions in the self-aligned etch process step. The self-aligned etch process module is set up to remove the gate material/oxides/silicon substrate. In the end of the self-aligned etch process step, the silicon substrate is etched to a depth deeper than the junction depths of MOSFET device source/drain electrodes and the control gates of LGNVM cells such that the electric connections from the formations of source/drain electrodes 912 (corresponding to source/ drain electrodes 413/414/513/514) and the active area strips 911 are separated by the trenches 930 in the y-direction of the cell boundaries of the memory arrays. After completion of the front-end process, the silicon is then moved forward to the backend metallization process. The trenches 930 in the y-direction of the memory array are filled with dielectric material from the first ILD (Inter-Layer-Dielectrics) process in the backend metallization process. FIG. 9*d* shows the top-view of the memory array with first metal bitlines and common source metal bitlines after the contact and first metal process.

Figure 6C:
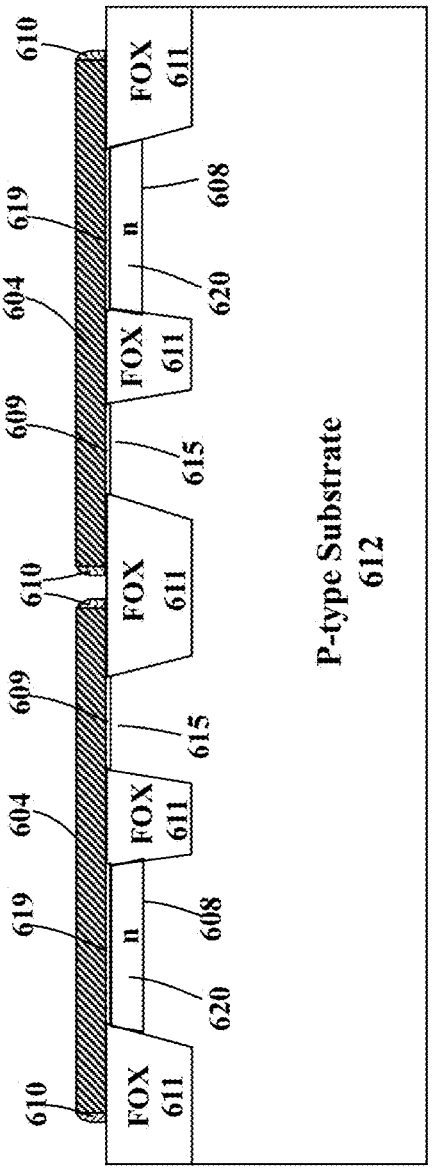
Figure 6C:
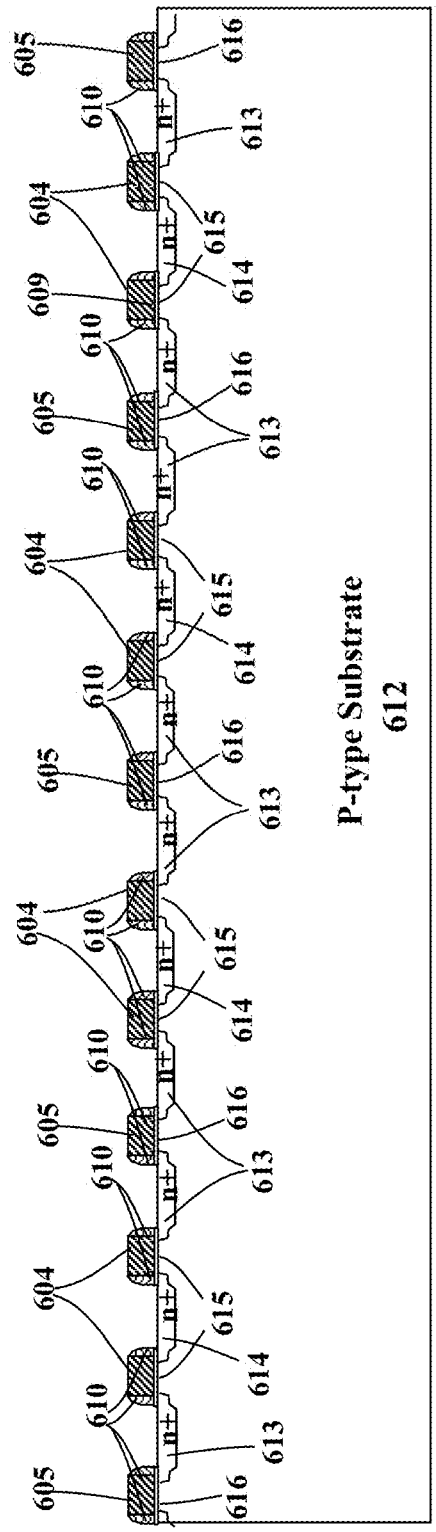
Figure 6D:
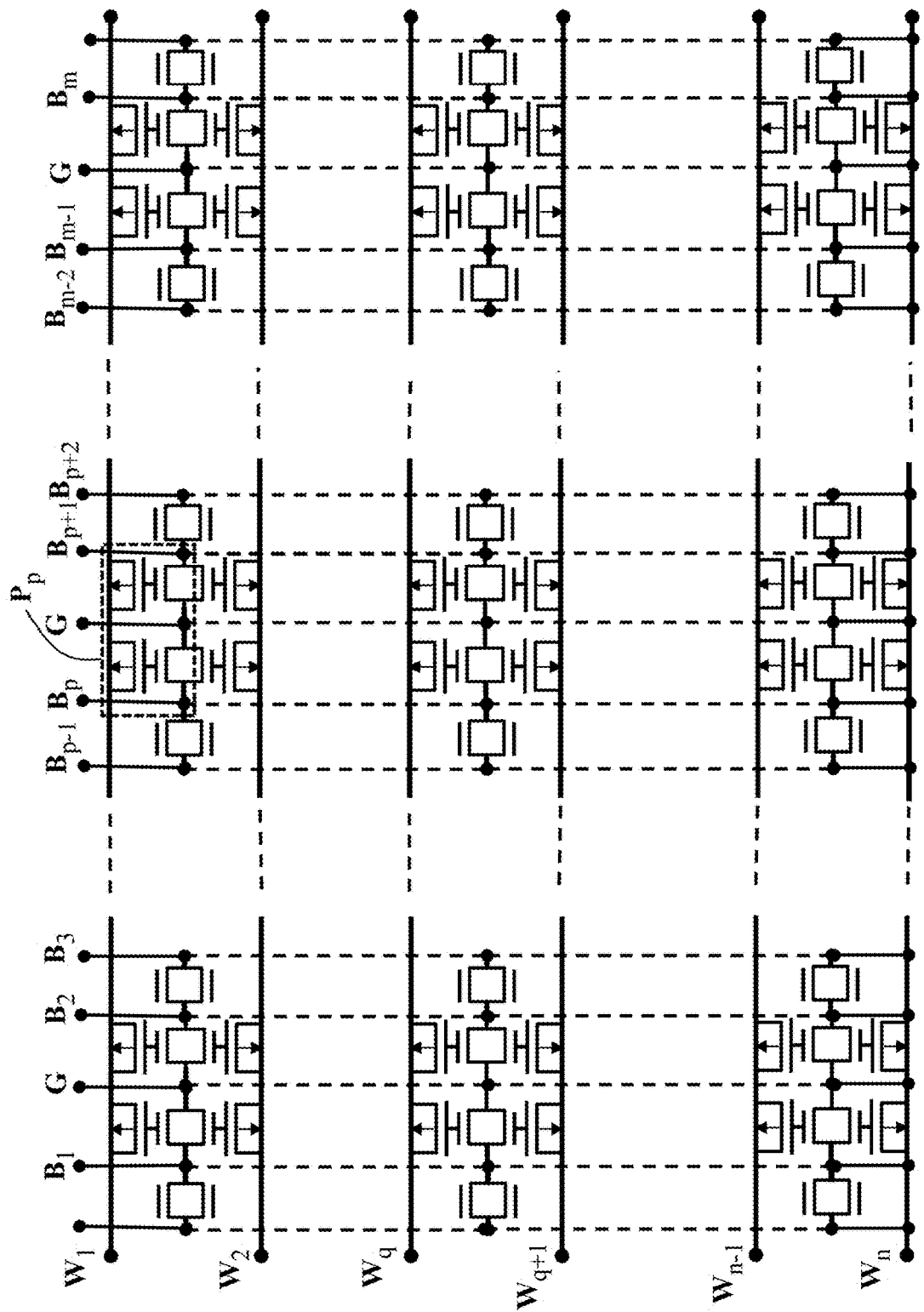
Figure 7A:
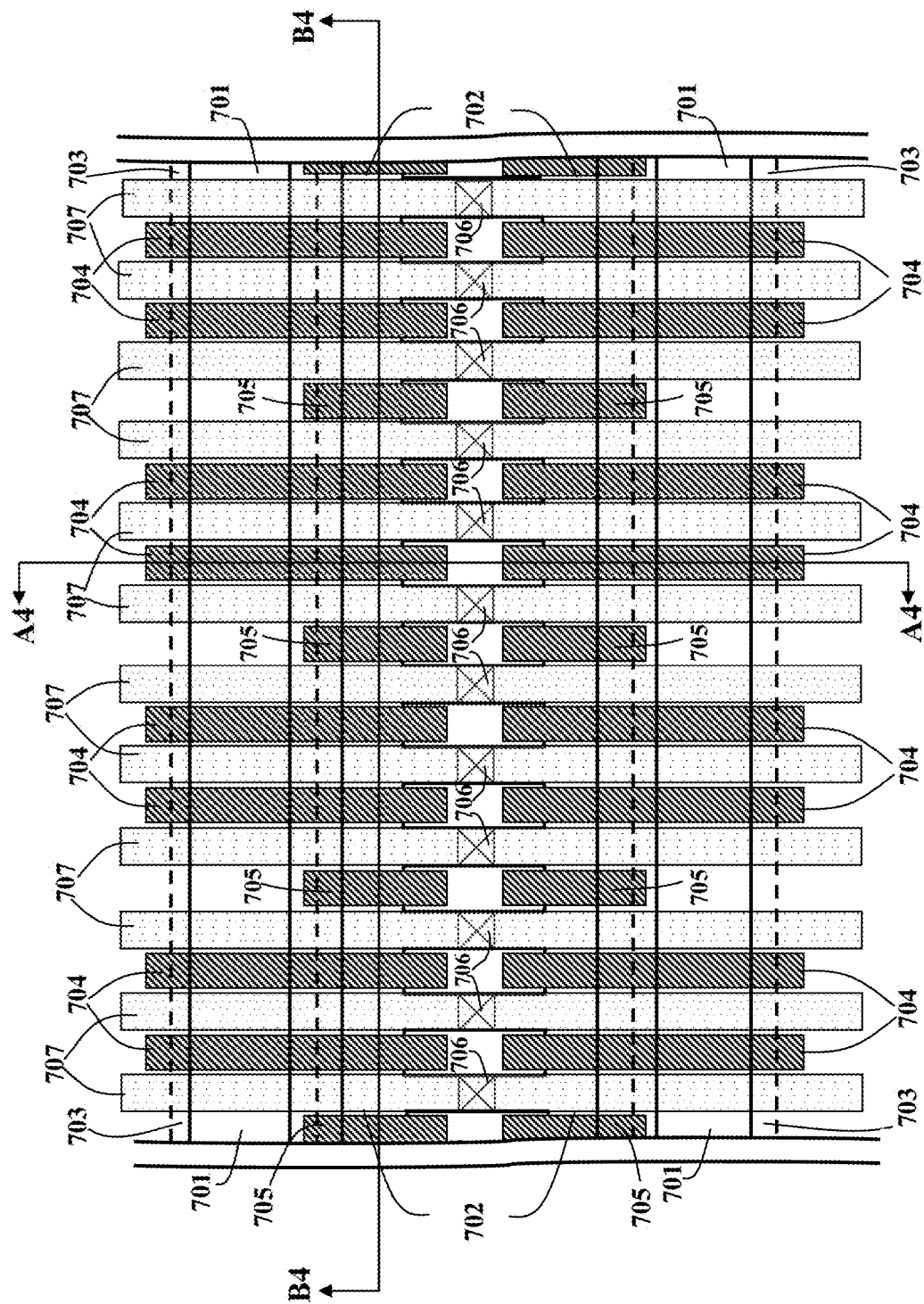
FIG. 7a shows the top view of the P-type SGLNVM flash array disclosed in U.S. Pat. No. 9,048,137 B2.
Figure 7C:
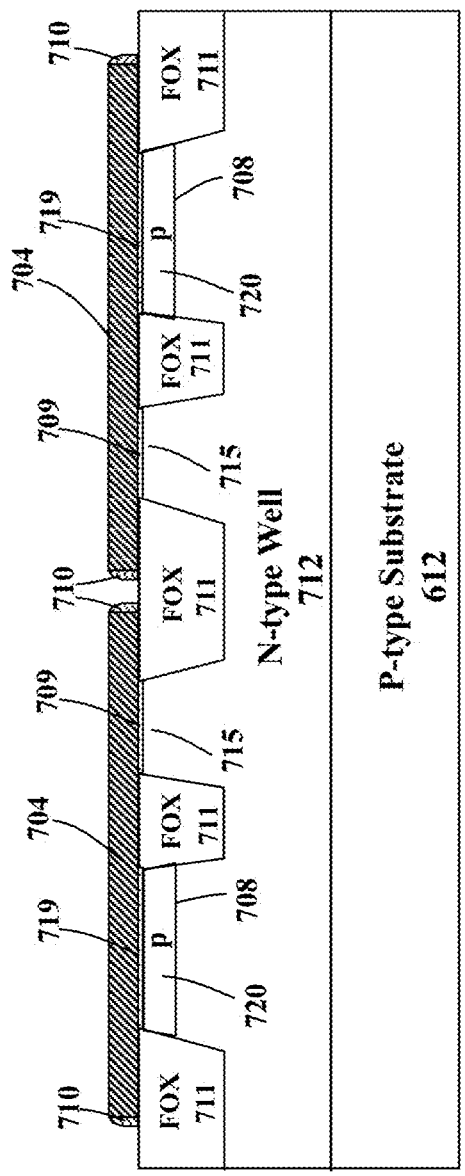
Figure 7C:
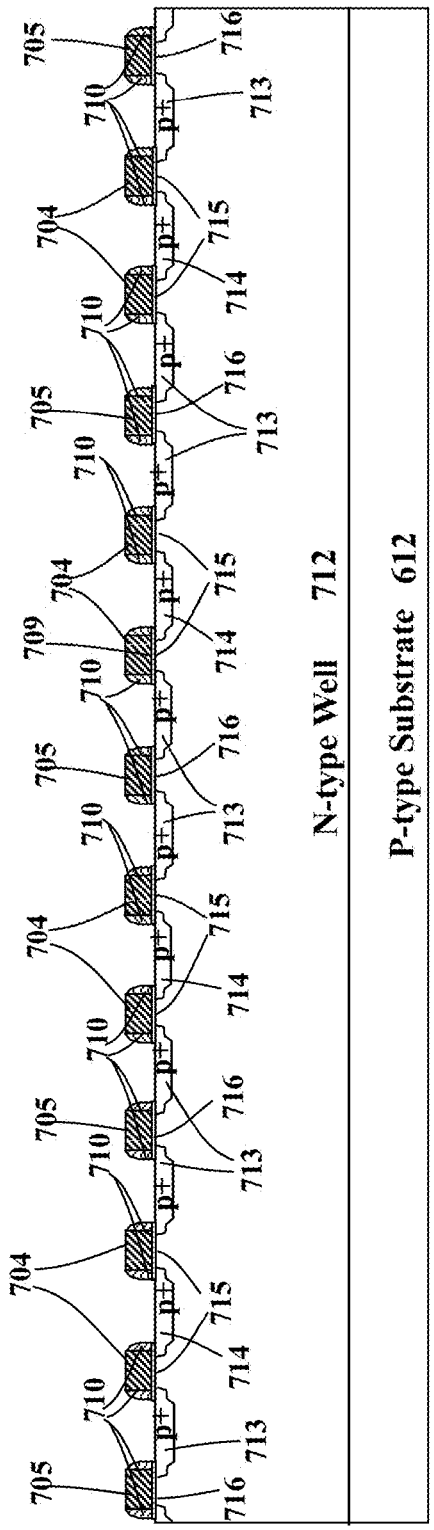
Figure 7D:
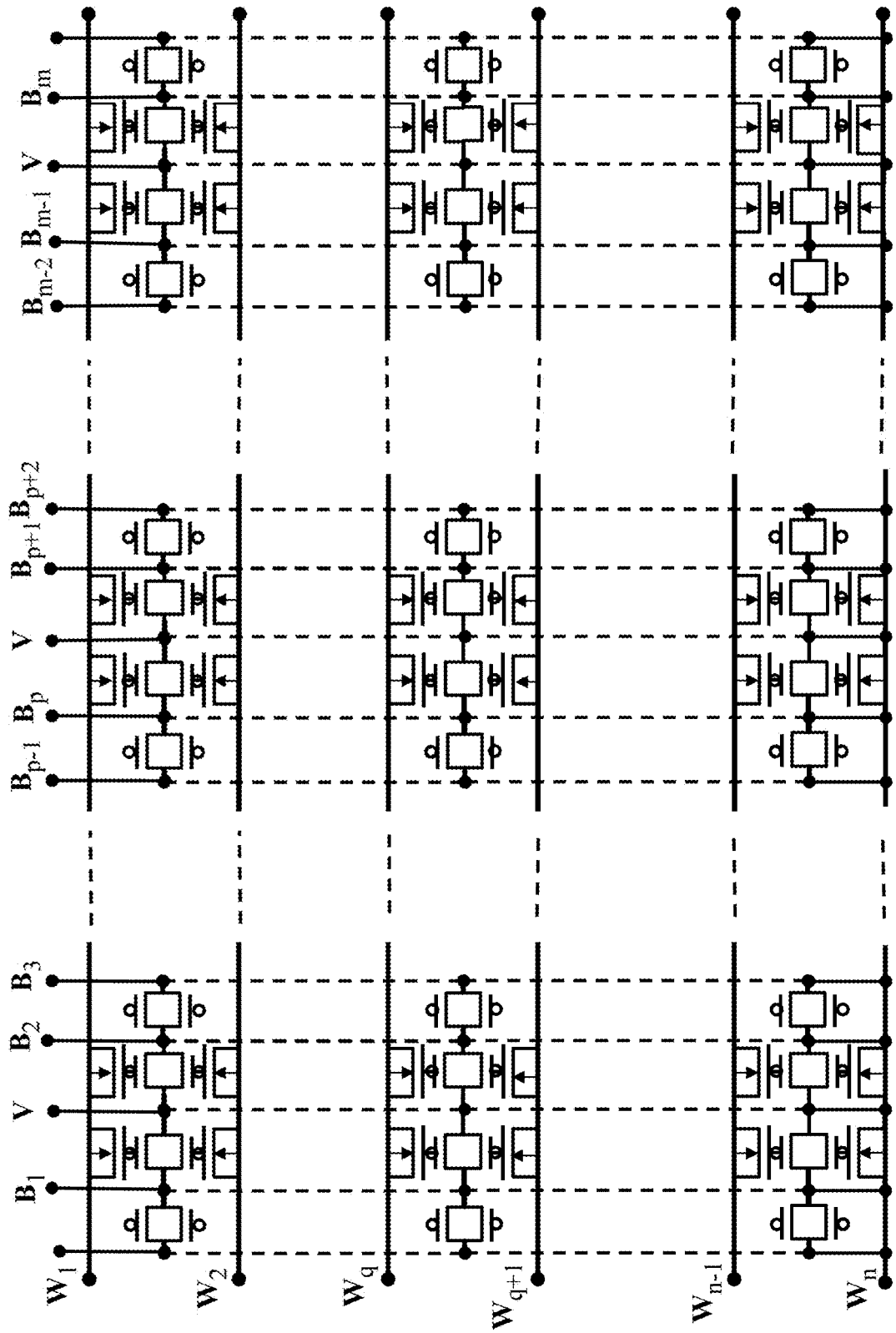
Figures 8A, 8B:
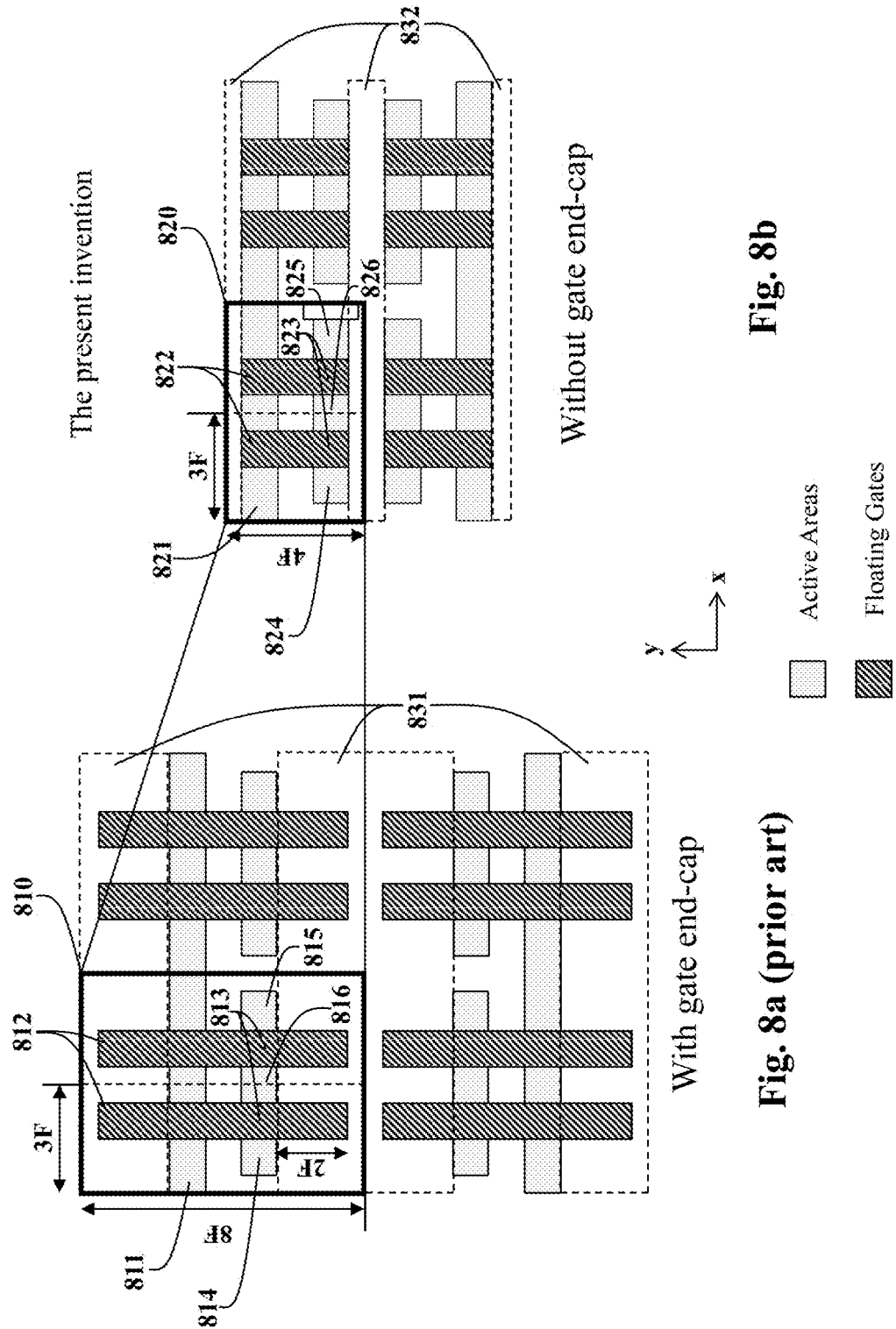
FIG. 8a shows a top-view of SGLNVM cell arrays for gate end-cap extension of 2 F with unit cell size of 24 $F^2$.
FIG. 8b shows a top-view of LGNVM cell arrays for no gate end-cap with unit cell size of 12 $F^2$.
Figure 10A:
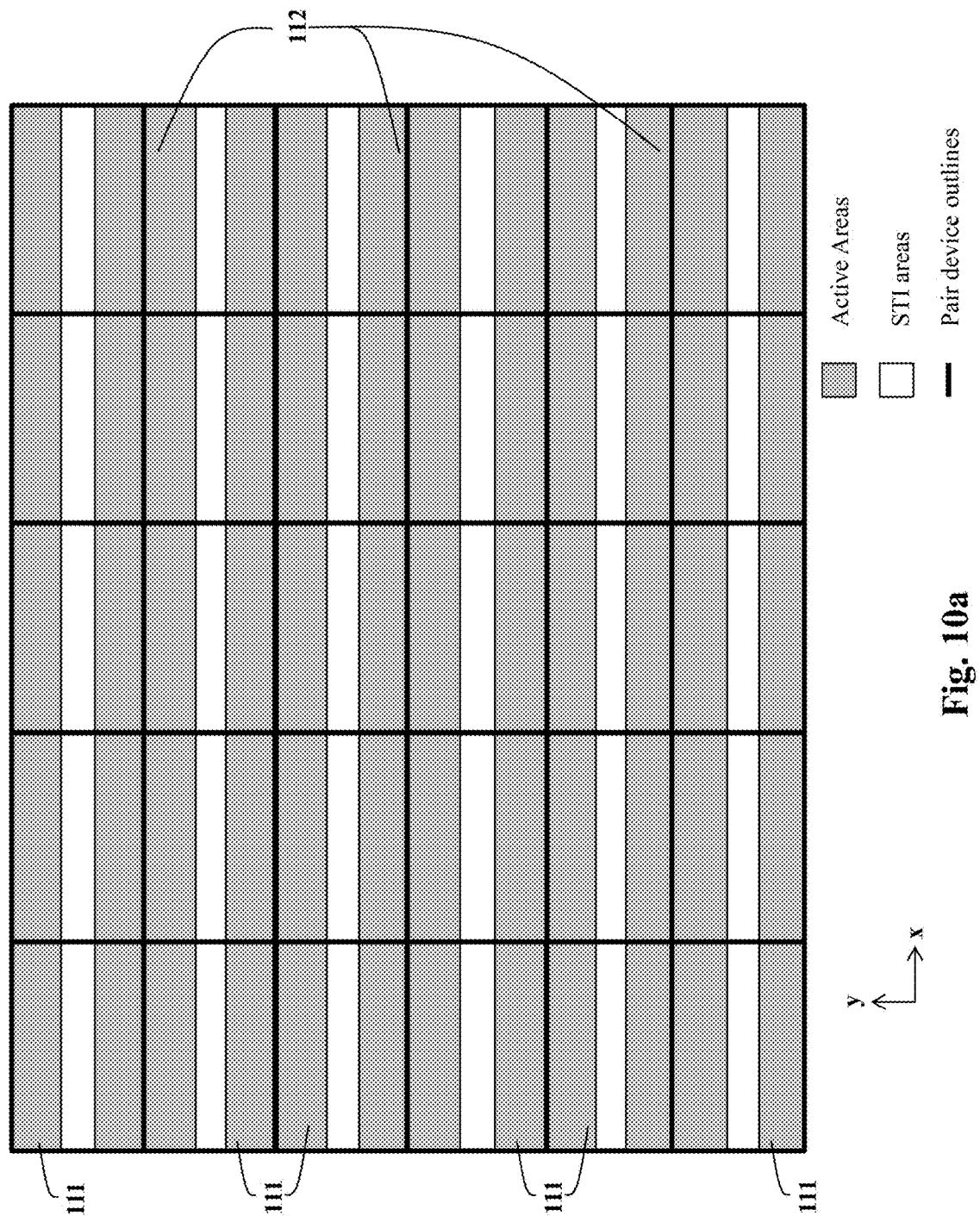
FIG. 10a shows the active area patterns in the memory arrays after STI process according to a second embodiment of the invention.

For another embodiment of this invention, field stop isolation (corresponding to dummy floating gates 605/705 in FIGS. 6*a*/6*c*/7*a*/7*c*) is applied to separate LGNVM device pairs along the x-direction in the memory arrays. In the embodiment, a self-aligned etch process step is used to simultaneously form the floating gate with zero end-cap and field isolation trenches at the y-direction cell boundary regions in the LGNVM cell arrays; besides, the rest of the fabrication process and the schematic diagram of the invention are the same as the descriptions of FIGS. 6*a*~6*d* and 7*a*~7*d*, unless otherwise indicated herein or clearly contradicted by context. The description for the same portions of the fabrication process and the schematic diagram is omitted herein. The well ion implantations to form the MOSFET devices' bodies usually start in the beginning of CMOS logic technology process. The STI process module follows after well ion implantations. The topologic view of parallel multiple active area strips in LGNVM array after STI module process is shown in FIG. 10*a*. To better view the LGNVM array, we have also drawn the memory cell boundary outlines of the LGNVM pair devices in the following figures. Each active area strip 111 contains two control gate areas (upper wordline and lower wordline) without STI separations. Each of the active area strips 112 contains two LGNVM source/drain active areas (upper cells and lower cells) without STI separation. Several ion implantations for MOSFET device threshold voltages and LGNVM control gates (corresponding to control gates 620/720) are performed after STI module. Gate oxides (corresponding to tunneling oxide 609/709 and isolation dielectric 619/719) are then grown for different MOSFET devices. The gate formation process module including a poly-silicon film deposited and etched to form the MOSFET device gates follows after gate oxides formation.

Figure 10B:
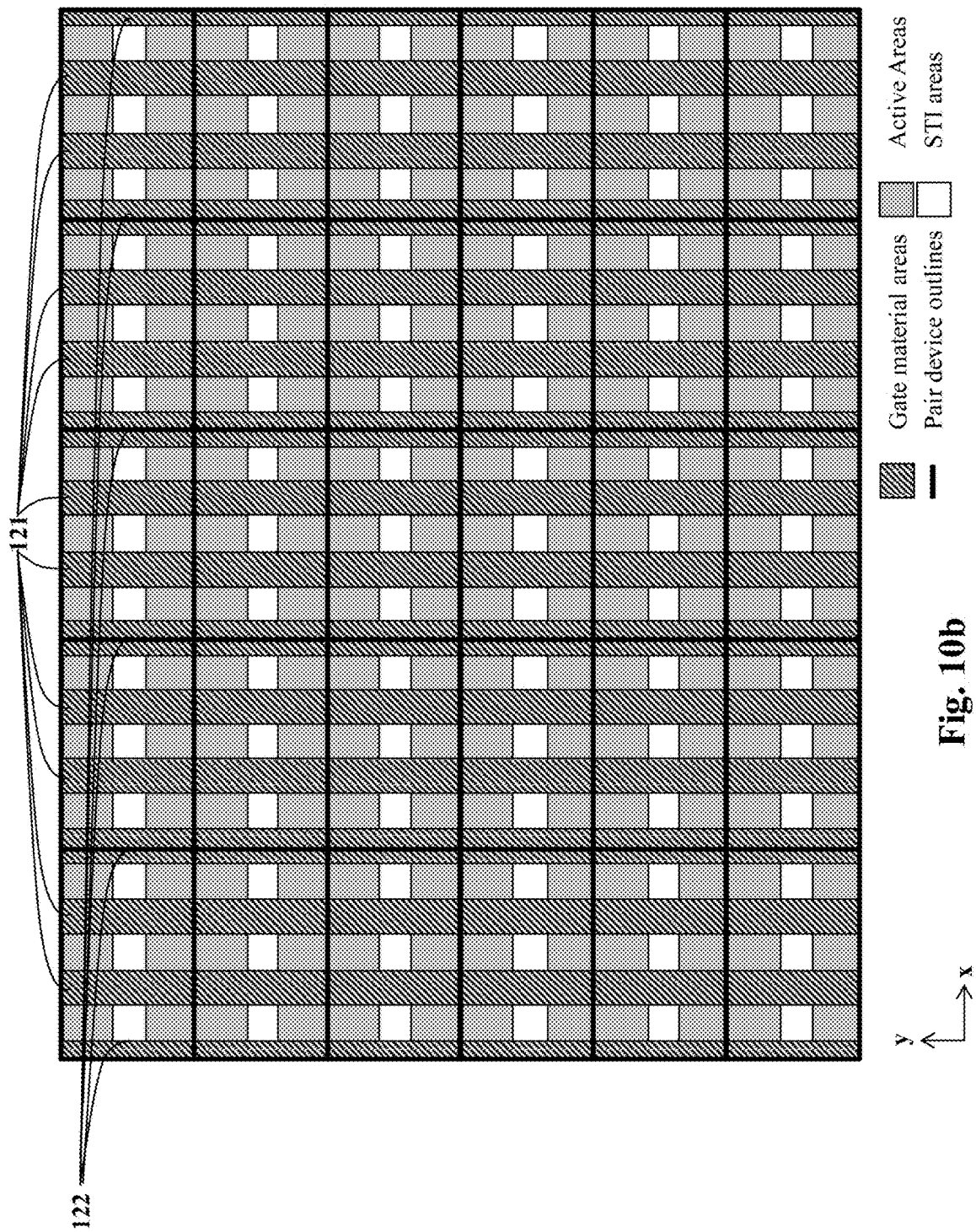
FIG. 10b the active areas and gate patterns in the memory arrays after gate formation process according to the second embodiment of the invention.

After the gate formation, the parallel vertical poly-silicon strips are formed in the LGNVM array. As shown in FIG. 10*b* the parallel vertical poly-silicon strips 121 and 122 are for floating gates (corresponding to floating gates 604/704) without being separated for the individual memory cell and for the dummy poly-silicon strips to isolate the LGNVM device pairs along the x-direction of the LGNVM arrays. The gate lengths of the floating gates and the lengths of the dummy poly-silicon strips of LGNVM device pairs are limited by the minimal gate length of a logic process technology node. Note that the opposite semiconductor type of the channel regions under the dummy poly-silicon strips 122 for the field stops can electrically separate the drain electrodes of the LGNVM pair devices along the x-direction of the memory arrays.

Figure 10C:
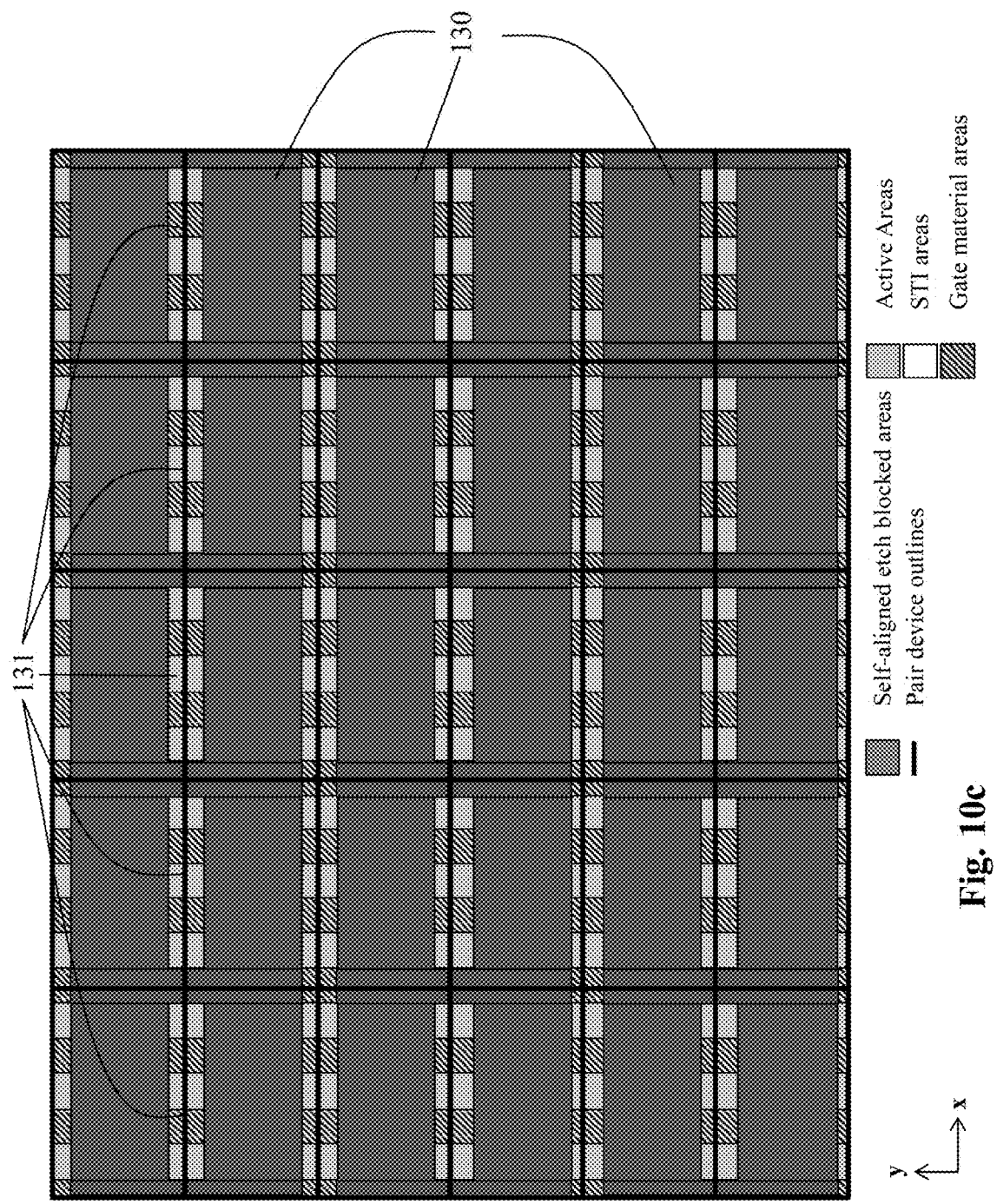
FIG. 10c shows the added mask patterns in the memory arrays for the self-aligned etch process module according to the second embodiment of the invention.

The separation of memory cell along the y-direction of the array is done by applying a mask with the blocking areas including the patterns containing multiple blocking strips 130 with multiple opening rectangles 131 inside the strips shown in FIG. 10*c* for the memory array and the whole areas outside the memory arrays to protect device patterns from etching reactions in the self-aligned etch process step. The self-aligned etch process module is set up to remove the gate material/oxides/silicon substrate. In the end of the self-aligned etch process step, the silicon substrate is etched to a depth deeper than the junction depth of MOSFET device source/drain electrodes and the control gates of LGNVM cells such that the electric connections from the formations of source/drain electrodes 112 (corresponding to drain electrodes 613/713 and source electrodes 6141714) and the active area strips 111 are separated by the trenches in the y-direction cell boundaries of the memory array. After completion of front-end process, the silicon is then moved forward to the backend metallization process. The trenches in the y-direction of the memory array are filled with dielectric material from the ILD (Inter-Layer-Dielectric) process. FIG. 10*d* shows the top-view of the memory array with metal bitlines and common source metal bitlines after contact and first metal process.

The aforementioned description of the preferred embodiments of the invention has been presented for purposes of illustration and description. It is not intended to be exhaustive or to limit the invention to the precise form or to exemplary embodiments disclosed. Accordingly, the description should be regarded as illustrative rather than restrictive. Obviously, many modifications and variations of geometrical shapes including lengths and widths, gate material or tunneling dielectrics will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array of nonvolatile memory (NVM) cells comprising:
    a plurality of source lines and bit lines; and
    a plurality of NVM cells organized in rows and columns on a substrate, each NVM cell having a source region, a drain region, a floating gate, a control gate region and a channel region, the NVM cells in a row being arranged in cell pairs, such that each cell pair comprises a sharing source region connected to a common source line and two drain regions connected to two different bit lines, wherein two drain regions of any two column-adjacent NVM cells in each row are connected to two different bit lines;

wherein the floating gate is disposed over and insulated from both the channel region and the control gate region and the floating gate extends in a column direction from the channel region to the control gate region, and wherein a gate width of the floating gate are aligned with the boundaries of the channel region and the control gate region without protruding from the channel region and the control gate region;

means for processing the array with CMOS logic technologies;

wherein the means for processing the array with CMOS logic technologies limits a gate length of the floating gate to a minimal feature size of a process technology node; and wherein the control gate region, the source region and the drain region have the same conductivity type; and wherein a control gate length of the array is perpendicular to the bit lines.

2. The array according to claim 1, wherein the control gate regions of the NVM cells in each row form a word line and any two adjacent word lines are isolated by a first isolation trench along the row direction.

3. The array according to claim 1, comprising:
a plurality of isolation regions extending in the column direction, wherein each isolation region is formed between two drain regions of any two column-adjacent cell pairs for each row.

4. The array according to claim 3, wherein the plurality of isolation regions are second isolation trenches along the column direction.

5. The array according to claim 4, wherein the drain and source regions of multiple cell pairs in any two adjacent rows are divided into two halves by a third isolation trench along the row direction.

6. The array according to claim 3, wherein the plurality of isolation regions are dummy poly-silicon strips, wherein each dummy poly-silicon strip forms a channel stop area between two drain regions of two column-adjacent cell pairs, and wherein the channel stop area has a semiconductor type opposite to its two adjacent drain regions.

7. The array according to claim 6, wherein the drain and source regions of any two row-adjacent cell pairs are divided into two halves by a fourth isolation trench along the row direction.

8. The array according to claim 1, wherein the control gate region has a conductivity type opposite to that of either the substrate or a corresponding well.

9. The array according to claim 1, wherein the control gate region is embedded in a silicon substrate.

10. The array according to claim 1, wherein the control gate region is insulated from the floating gate by a dielectric and a capacitive coupling is developed between the floating gate and the control gate region through the dielectric.

11. The array according to claim 1, wherein a minimal unit cell size of each NVM cell is limited by 12 $F^2$, where F is the minimal feature size of the process technology node.

12. A method for manufacturing an array of nonvolatile memory (NVM) cells, each NVM cell having a source region, a drain region, a floating gate, a control gate region and a channel region, wherein the NVM cells are organized in rows and columns on a substrate and the NVM cells in a row are arranged in cell pairs, such that each cell pair comprises a sharing source region connected to a common source line and two drain regions connected to two different bit lines, the method comprising the steps of:

defining a plurality of active area strips and a plurality of rows of active area rectangles in the substrate in alternate manner and extending in a row direction by a shallow trench isolation module;

performing a first ion implantation into the active area strips to form the control gate regions;

growing oxides over the active area strips and the active area rectangles;

depositing and etching a poly-silicon film over the active area strips and the active area rectangles to form a plurality of poly-silicon strips extending in a column direction;

depositing a mask over the substrate, wherein the mask comprises a plurality of block strips along the row direction; and etching through the mask, the poly-silicon strips and the oxides into the substrate to form a plurality of trenches extending in the row direction such that each of the active area strips and the active area rectangles is divided into two halves and the poly-silicon strips are divided to form the floating gates;

wherein a gate width of the floating gate of each NVM cell is aligned with the boundaries of its channel region and control gate region without protruding from its channel region and control gate region.

13. The method according to claim 12, further comprising:
performing a second ion implantation into the active area rectangles to form the drain and source regions.

14. The method according to claim 13, wherein the control gate regions, the source regions and the drain regions have the same conductivity type.

15. The method according to claim 12, wherein the active area rectangles in a row are isolated and disposed along the row direction, and each active area rectangle is intersected with two of the poly-silicon strips after the step of depositing and etching the poly-silicon film.

16. The method according to claim 12, further comprising:
performing well ion implantations into the substrate to form bodies of MOSFET devices before the step of defining.

17. The method according to claim 12, wherein a gate length of the floating gate of each NVM cell is defined by a minimal feature size of a process technology node, wherein a minimal unit cell size of each NVM cell is limited by 12 $F^2$, where F is the minimal feature size of the process technology node.

18. A method for manufacturing an array of nonvolatile memory (NVM) cells, each NVM cell having a source region, a drain region, a floating gate, a control gate region and a channel region, wherein the NVM cells are organized in rows and columns on a substrate and the NVM cells in a row are arranged in cell pairs, such that each cell pair comprises a sharing source region connected to a common source line and two drain regions connected to two different bit lines, the method comprising the steps of:

defining a plurality of first active area strips and a plurality of second active area strips in the substrate in alternate manner and extending in a row direction by a shallow trench isolation module;

performing a first ion implantation into the first active area strips to form the control gate regions;

growing oxides over the first active area strips and the second active area strips;

depositing and etching a poly-silicon film over the first active area strips and the second active area strips to form a plurality of first poly-silicon strips and a plurality of second poly-silicon strips along the column direction;

depositing a mask over the substrate, wherein the mask comprises a plurality of first blocking strips along the row direction and a plurality of second blocking strips along the column direction; and etching through the mask, the first and the second poly-silicon strips and the oxides into the substrate to form a plurality of trenches along the row direction that respectively divide each first active area strip and the drain and source regions of any two row-adjacent cell pairs;

wherein a gate width of the floating gate of each NVM cell is aligned with the boundaries of its channel region and control gate region without protruding from its channel region and control gate region.

19. The method according to claim 18, wherein the first poly-silicon strips are divided to form the floating gates and the second poly-silicon strips are divided to form a plurality of dummy poly-silicon strips after the step of etching through the mask, the first and the second poly-silicon strips and the oxides into the substrate.

20. The method according to claim 19, wherein each dummy poly-silicon strip forms a channel stop area between two drain regions of two column-adjacent cell pairs, and wherein the channel stop area has a semiconductor type opposite to its two adjacent drain regions.

21. The method according to claim 18, further comprising:
performing a second ion implantation into the second active area strips to form the drain and source regions.

22. The method according to claim 21, wherein the control gate regions, the source regions and the drain regions have the same conductivity type.

23. The method according to claim 18, wherein a gate length of the floating gate of each NVM cell is defined by a minimal feature size of a process technology node, and wherein a minimal unit cell size of each NVM cell is limited by 12 $F^2$, where F is the minimal feature size of the process technology node.

24. The method according to claim 18, further comprising:
performing well ion implantations into the substrate to form bodies of MOSFET devices before the step of defining.

* * * * *